US012267053B2

(12) United States Patent
Takeda et al.

(10) Patent No.: US 12,267,053 B2
(45) Date of Patent: Apr. 1, 2025

(54) DIFFERENTIAL AMPLIFIER, SEMICONDUCTOR DEVICE AND OFFSET CANCELLATION METHOD

(71) Applicant: RENESAS ELECTRONICS CORPORATION, Tokyo (JP)

(72) Inventors: Koichi Takeda, Tokyo (JP); Takahiro Shimoi, Tokyo (JP); Masaya Nakano, Tokyo (JP); Hidenori Mitani, Tokyo (JP); Yoshinobu Kaneda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 309 days.

(21) Appl. No.: 17/965,308

(22) Filed: Oct. 13, 2022

(65) Prior Publication Data

US 2023/0145662 A1 May 11, 2023

(30) Foreign Application Priority Data

Nov. 5, 2021 (JP) .................................. 2021-181109

(51) Int. Cl.
*H03F 1/02* (2006.01)
*H03F 3/45* (2006.01)

(52) U.S. Cl.
CPC ..... *H03F 3/45744* (2013.01); *H03F 3/45497* (2013.01); *H03F 3/45511* (2013.01); *H03F 3/45183* (2013.01); *H03F 3/45475* (2013.01)

(58) Field of Classification Search
CPC ............. H03F 3/45744; H03F 3/45497; H03F 3/45511; H03F 3/45596; H03F 3/45475;
(Continued)

(56) References Cited

U.S. PATENT DOCUMENTS 4,264,872 A * 4/1981 Suzuki ................ H03F 3/45753
330/253
7,248,106 B2 * 7/2007 Draxelmayr .............. H03F 3/72
327/307

(Continued)

FOREIGN PATENT DOCUMENTS

JP          S55-72863 A       6/1980
JP        2005-102108 A       4/2005
(Continued)

OTHER PUBLICATIONS

Decision of Refusal of Japanese Counterpart Application dated Nov. 18, 2024, from corresponding Japanese Patent Application No. 2021-181109, 10 pages.

*Primary Examiner* — Khanh V Nguyen
(74) *Attorney, Agent, or Firm* — Rimon P.C.

(57) ABSTRACT

Speed enhancement of data reading is achieved while suppressing an influence of an offset voltage of a differential amplifier. The differential amplifier includes: a current source that is connected to a first power supply in which a suppliable current is a first current; an active element pair that is connected to the current source, and amplifies a signal input to an input terminal pair to output an output signal pair; a load element pair that is connected to a second power supply different in power supply voltage from the first power supply, the load element pair serving for outputting the output signal pair to an output terminal pair; and a capacitance element pair that is inserted between an external input terminal pair and the input terminal pair; a switching element pair that charges the capacitance element pair to generate a voltage, which is obtained by converting an offset voltage of the input terminal pair into an input voltage, in the capacitance element pair by short-circuiting corresponding terminals between the output terminal pair and the input terminal pair; and a current control circuit that controls a (Continued)

current suppliable by the current source to a second current larger than the first current at a time of performing the charge.

13 Claims, 13 Drawing Sheets

(58) Field of Classification Search
CPC .. H03F 1/301; H03F 3/45179; H03F 3/45968; H03F 3/45085; H03F 1/3211; H03F 3/45071; H03F 3/45183; H03F 3/45192; H03F 3/45089; H03F 1/303; H03F 3/005; H03F 1/02; H03F 3/45; G11C 7/062; G11C 29/026; G11C 7/08; G11C 7/06
USPC .................................................. 330/252–261
See application file for complete search history.

(56) References Cited

U.S. PATENT DOCUMENTS

| | | | |
|---|---|---|---|
| 9,053,806 B2 | | 6/2015 | Kono |
| 11,889,212 B2 | * | 1/2024 | Chiba ................ H03K 5/2481 |
| 2015/0138411 A1 | * | 5/2015 | Nakamura ............ H03K 5/249 |
| | | | 327/54 |
| 2015/0255165 A1 | | 9/2015 | Tran et al. |
| 2020/0219560 A1 | | 7/2020 | Sasaki et al. |

FOREIGN PATENT DOCUMENTS

| | | |
|---|---|---|
| JP | 2014-086111 A | 5/2014 |
| JP | 2017-511949 A | 4/2017 |
| JP | 2020-113347 A | 7/2020 |

* cited by examiner

DIFFERENTIAL AMPLIFIER, SEMICONDUCTOR DEVICE AND OFFSET CANCELLATION METHOD

CROSS-REFERENCE TO RELATED APPLICATIONS

The disclosure of Japanese Patent Application No. 2021-181109 filed on Nov. 5, 2021 including the specification, drawings and abstract is incorporated herein by reference in its entirety.

BACKGROUND

The present invention relates to a differential amplifier, a semiconductor device, and an offset cancellation method.

Data reading from a memory in a semiconductor device is performed in such a manner that data held in a memory cell is converted into a weak potential difference from a reference potential, and that this potential difference is subjected to differential amplification by a differential amplifier (sense amplifier). Meanwhile, in order to prevent generation of an offset voltage, the differential amplifier is designed in consideration of symmetry; however, characteristics of pair transistors which constitute the differential amplifier have manufacturing variations, and a slight offset voltage is present in an input terminal pair of the differential amplifier. The presence of this offset voltage hinders an accurate input of the above-described potential difference to the differential amplifier, and this leads to an error in the data reading, and therefore, it is necessary to suppress an influence of the offset voltage as much as possible.

As means for suppressing the influence of the offset voltage of the differential amplifier, for example, a digital offset cancellation mechanism described in Patent Document 1 is known. This digital offset cancellation mechanism is a mechanism that allows latch circuits to hold detection results of the offset voltage, and turns on/off compensating constant current sources by operations of the latch circuits to compensate an offset.

There are disclosed techniques listed below.
[Patent Document 1] Japanese Unexamined Patent Application Publication No. 2014-086111

SUMMARY

However, in the above-described digital offset cancellation mechanism, it is necessary to increase the latch circuits and the constant current sources in number in order to improve compensation accuracy of the offset voltage. In this case, not only a circuit area is increased according to the number of latch circuits, but also it takes long to compensate the offset voltage at the time of product shipment, and this increases test cost. Therefore, it is being difficult to respond to the request in the market for further speed enhancement of the data reading.

Due to the above-described circumstances, such a technology is desired that can achieve the speed enhancement of the data reading while suppressing the influence of the offset voltage of the differential amplifier.

A differential amplifier according to an embodiment includes: a current source that is connected to a first power supply in which a suppliable current is a first current; an active element pair that is connected to the current source, and amplifies a signal input to an input terminal pair to output an output signal pair; a load element pair that is connected to a second power supply different in power supply voltage from the first power supply, the load element pair serving for outputting the output signal pair to an output terminal pair; a capacitance element pair that is inserted between an external input terminal pair and the input terminal pair; a switching element pair that performs an offset cancellation operation to charge the capacitance element pair such as to cause the capacitance element pair to generate a voltage by short-circuiting corresponding terminals between the output terminal pair and the input terminal pair, the voltage being obtained by converting an offset voltage of the input terminal pair into an input voltage; and a current control circuit that controls a current suppliable by the current source to be a second current larger than the first current at a time of performing the offset cancellation operation.

According to the embodiment, the speed enhancement of the data reading can be achieved while suppressing the influence of the offset voltage of the differential amplifier.

DETAILED DESCRIPTION

Figure 1:
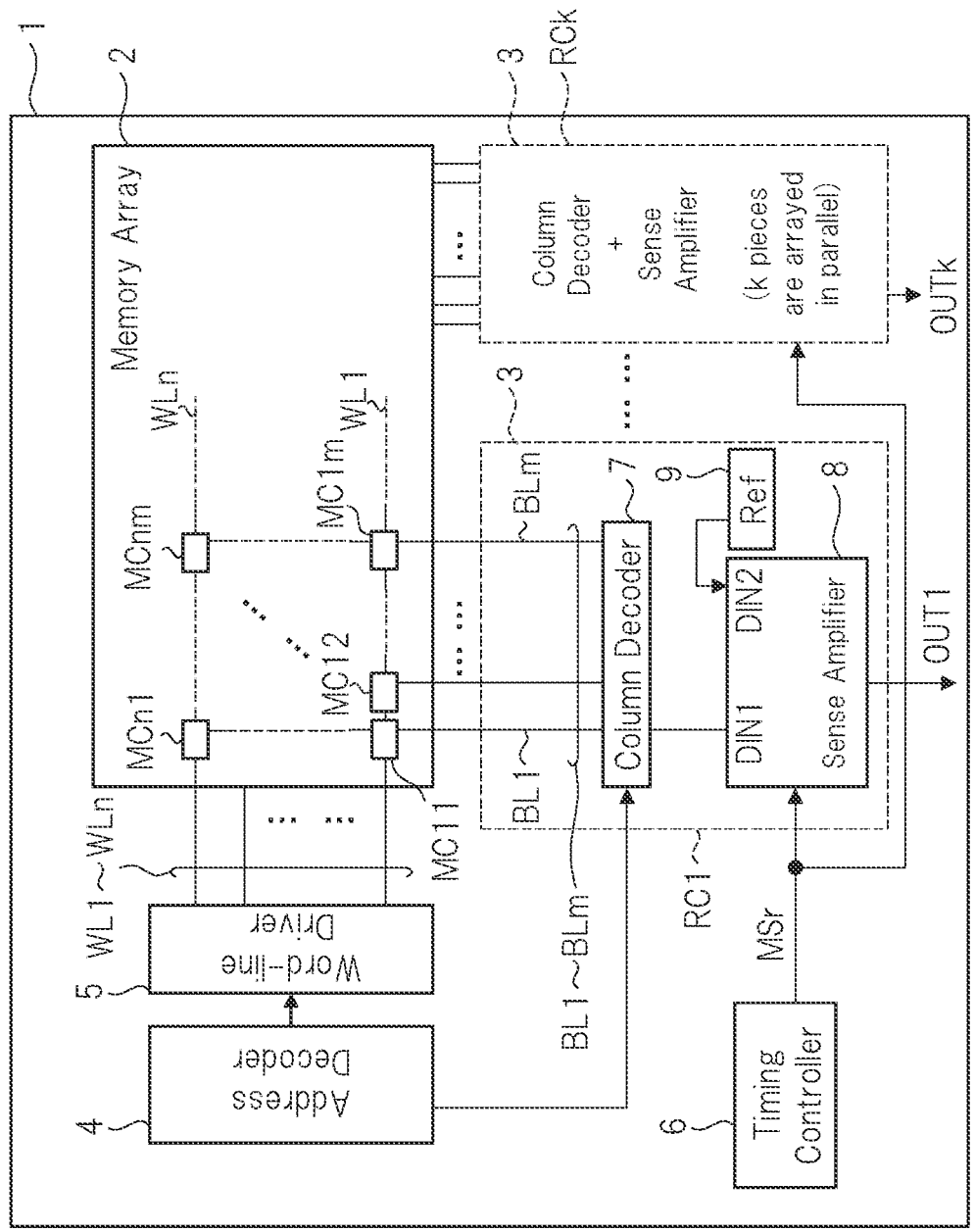
FIG. 1 is a diagram schematically showing a configuration of a semiconductor storage device.

Next, embodiments will be described. Note that each of the embodiments to be described below is merely an example for achieving the invention of the present application, and does not limit the technical scope of the invention of the present application. Moreover, in each of the following embodiments, the same reference numerals are assigned to components which have the same functions, and repeated descriptions thereof will be omitted unless otherwise required.

The scope of the present application is not limited to a specific semiconductor device, and the present application is applicable to a variety of semiconductor devices, each of which performs data reading using a sense amplifier (differential amplifier). Herein, a description is given of, as an example, a case where the present application is applied to a semiconductor storage device.

Configuration of Semiconductor Storage Device

A configuration of a semiconductor storage device is described.

FIG. 1 is a diagram schematically showing a configuration of a semiconductor storage device. As shown in FIG. 1, a semiconductor storage device 1 includes a memory array 2, a plurality of amplifier blocks 3, an address decoder 4, a word-line driver 5, and a timing controller 6.

The memory array 2 is a memory cell group in which a large number of memory cells MC11 to MCnm are arranged in a two-dimensional matrix. One bit line pair is connected to a plurality of the memory cells arranged in one column. Moreover, one word line is connected to a plurality of the memory cells arranged in one row. A memory cell from which data is to be read out is identified in such a manner that a bit line pair of the memory cell is selected and that a word line of the memory cell is selected. The memory array 2 is managed for each of a plurality of divided memory blocks. The memory block is an aggregate of a plurality of the memory cells arranged in a fixed number of columns.

The plurality of amplifier blocks 3 are present, and one amplifier block 3 is in charge of one memory block. Each of the amplifier blocks 3 includes a column decoder 7, a sense amplifier 8, and a reference signal generator 9.

The address decoder 4 is connected to the column decoder 7 and the word-line driver 5, and controls the column decoder 7 and the word-line driver 5 to select the desired memory cell from which data is to be read out.

The column decoder 7 is connected to a plurality of bit lines. The column decoder 7 receives a control from the address decoder 4, and selects a bit line, which is connected to the desired memory cell, from among the plurality of bit lines.

The word-line driver 5 is connected to a plurality of the word lines. The word-line driver 5 receives a control from the address decoder 4, and selects a word line, which is connected to the desired memory cell, from among the plurality of word lines. At the time of reading out data from the desired memory cell, the word-line driver 5 activates the selected word line, and connects the bit line of the desired memory cell, which is selected by the column decoder 7, to a data input path DIN1 of the sense amplifier 8.

The reference signal generator 9 has a reference signal line REF, and outputs a reference voltage Vref to the reference signal line REF. The reference voltage Vref is used for generating a reference current signal to be compared with a current signal read from such a bit line BL of the target memory cell at the time of reading out the data stored in the desired memory cell. The reference signal line REF is connected to a data input path DIN2 of the sense amplifier 8.

The timing controller 6 is connected to the sense amplifier 8. The timing controller 6 outputs, to the sense amplifier 8, a signal group MSr for operating the sense amplifier 8. The timing controller 6 outputs each of signals, which constitute the signal group MSr, at a voltage corresponding to a "high (H)" level, a "low (L)" level, or a level between "H" and "L", and controls switching timing between outputs of these.

The sense amplifier 8 incorporates a differential amplifier circuit (not shown in FIG. 1). The sense amplifier 8 is connected to the column decoder (also referred to as a column selector) 7, and further, is connected to the reference signal generator 9. The bit line BL connected to the desired memory cell selected by the column decoder 7 is connected to the data input path DIN1 of the differential amplifier circuit. Moreover, the reference signal line REF of the reference signal generator 9 is connected to the data input path DIN2 of the differential amplifier circuit. The sense amplifier 8 is also connected to the timing controller 6. For the signal group MSr required to operate the sense amplifier 8, the sense amplifier 8 receives, from the timing controller 6, a control as to setting timing and level of the signal thereof.

Standard Technology

A sense amplifier according to a standard technology is described. This sense amplifier according to the standard technology is a sense amplifier that serves as a standard (base) or a comparative example to a configuration of each of the embodiments to be described later.

Configuration of Sense Amplifier According to Standard Technology

Figure 2:
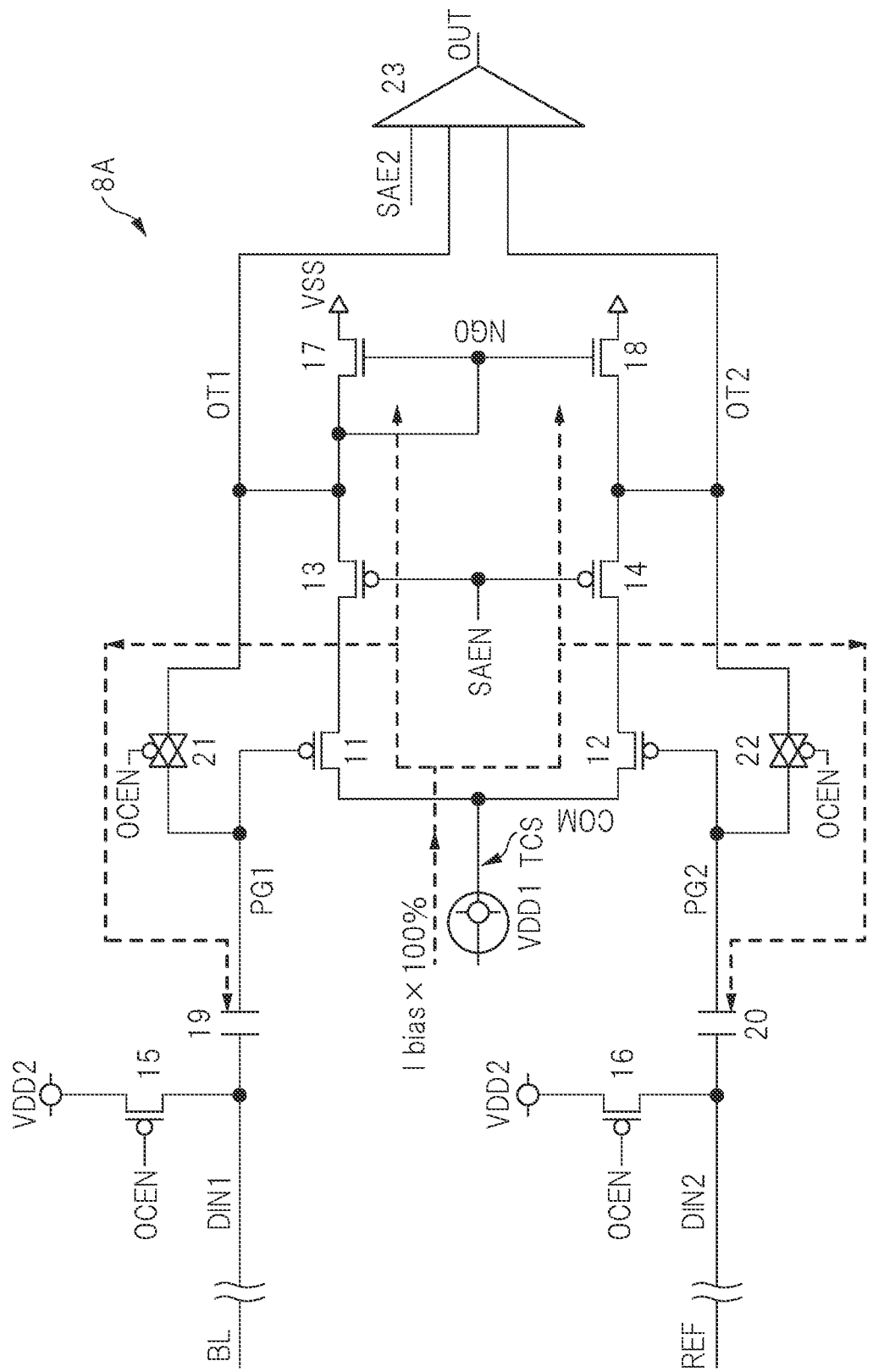
FIG. 2 is a diagram showing a configuration of a sense amplifier according to a standard technology.

FIG. 2 is a diagram showing a configuration of the sense amplifier according to the standard technology. A sense amplifier 8A shown in FIG. 2 is a CMOS current mirror-type differential sense amplifier. Moreover, the sense amplifier 8A is an example of a sense amplifier in which an input stage is provided with capacitance elements which hold voltages compensating an offset voltage, that is, with capacitors. Note that the offset voltage is a voltage generated due to a difference in characteristics between pair transistors connected to the input stage of the sense amplifier. In the present embodiment, the offset voltage refers to a differential voltage between a gate threshold voltage required for one of the pair transistors to turn "on" and a gate threshold voltage required for the other of the pair transistors to turn "on".

As shown in FIG. 2, the sense amplifier 8A includes PMOS transistors 11 to 16, NMOS transistors 17 and 18, capacitors 19 and 20, switches 21 and 22, and a differential amplifier 23. A power supply VDD1 is connected to the sense amplifier 8A. In FIG. 2, characteristic current flows are shown by dashed arrows.

Note that, in the present specification, a power supply VDDn (n=integer) indicates a power supply in which a voltage is VDDn, and a power supply VCCn (n=integer) indicates a power supply in which a voltage is VCCn. Moreover, in each of the embodiments, it is defined that the voltage VDDn is equal to a voltage VDD, and that the voltage VCCn is equal to a voltage VCC. A power supply VSS has a power supply voltage lower than the power supply VDDn, and for example, this power supply voltage is a ground voltage of the sense amplifier.

The PMOS transistors 11 and 13 and the NMOS transistor 17 are connected in series to one another between a path of the power supply VDD1 and a path of the power supply VSS. Moreover, the PMOS transistors 12 and 14 and the NMOS transistor 18 are connected in series to one another between a path of the power supply VDD1 and a path of the power supply VSS. The power supply VSS generally has a power supply voltage lower than the power supply VDD1, and for example, this power supply voltage is a ground voltage of the sense amplifier 8A.

Note that the PMOS transistors 11 and 12 form P-channel-side pair transistors of the sense amplifier 8A, and the NMOS transistors 17 and 18 form N-channel-side pair transistors of the sense amplifier 8A.

Both of a gate of the PMOS transistor 13 and a gate of the PMOS transistor 14 receive a signal SAEN. When the signal SAEN is at the "H" level, the PMOS transistors 13 and 14 turn "off", and a circuit above the PMOS transistors 13 and 14 in terms of an operating voltage (hereinafter, sometimes simply referred to as an "above circuit") and a circuit below the PMOS transistors 13 and 14 in terms of the operating voltage (hereinafter, sometimes simply referred to as a "below circuit") are separated from each other. That is, an operation of a differential amplifier, which is performed by these circuits, stops. In contrast, when the signal SAEN is at the "L" level, the PMOS transistors 13 and 14 turn "on", and the circuit above the PMOS transistors 13 and 14 and the circuit below the PMOS transistors 13 and 14 are connected to each other. That is, these circuits function as a differential amplifier.

A gate of the NMOS transistor 17 and a gate of the NMOS transistor 18 are connected to each other by a node common thereto. Herein, this node is called a node NGO. A gate and source of the NMOS transistor 17 are connected to each other. Thus, the NMOS transistors 17 and 18 form a configuration of a current mirror.

Sources of the PMOS transistors 11 and 12 are connected to each other by a node common thereto. This node is called a node COM. To the node COM, a path of the power supply VDD1 is connected through a tail current source TCS. The tail current source TCS has a limitation on an amount of current flowable therethrough, and the maximum amount of current is a tail current Ibias.

The capacitor 19 is connected between a data input path DIN1 to which a bit line BL is connected and a gate of the PMOS transistor 11. The PMOS transistor 15 is connected between a path of a power supply VDD2 (an example of a "fifth power supply" in the present application) and the data input path DIN1 connected to the bit line BL, and a gate thereof receives a signal OCEN. The capacitor 20 is connected between a data input path DIN2 to which a reference signal line REF is connected and a gate of the PMOS transistor 12. The PMOS transistor 16 is connected between a path of a power supply VDD2 and the data input path DIN2 connected to the reference signal line REF, and a gate thereof receives a signal OCEN.

A node OT1 is a node that connects the PMOS transistor 13 and the NMOS transistor 17 to each other. A node OT2 is a node that connects the PMOS transistor 14 and the NMOS transistor 18 to each other.

The switch 21 is connected between a node PG1 connected to the gate of the PMOS transistor 11 and the node OT1, and an enable terminal thereof receives a signal OSEN. The switch 22 is connected between a node PG2 connected to the gate of the PMOS transistor 12 and the node OT2, and an enable terminal thereof receives a signal OSEN. The switches 21 and 22 turn "on", that is, conduct when the signals OSEN received by the enable terminals thereof are at the "L" level.

One of input terminals of the differential amplifier 23 is connected to the node OT1 between the PMOS transistor 13 and the NMOS transistor 17. The other of the input terminals of the differential amplifier 23 is connected to the node OT2 between the PMOS transistor 14 and the NMOS transistor 18. An enable terminal of the differential amplifier 23 receives a signal SAE2. The differential amplifier 23 outputs an output signal to an output terminal OUT when the signal SAE2 received by the enable terminal thereof is at the "H" level.

The PMOS transistor 15 is connected between the path of the power supply VDD2 and the data input path DIN1, and a gate thereof receives the signal OCEN. Likewise, the PMOS transistor 16 is connected between the path of the power supply VDD2 and the data input path DIN2, and a gate thereof receives the signal OCEN. When the signal OCEN goes to the "L" level, the PMOS transistors 15 and 16 turn "on", and the data input paths DIN1 and DIN2 are precharged with a potential of the power supply VDD2, and are initialized.

Operation of Sense Amplifier According to Standard Technology

An operation of the sense amplifier 8A according to the standard technology is described.

Figure 3:
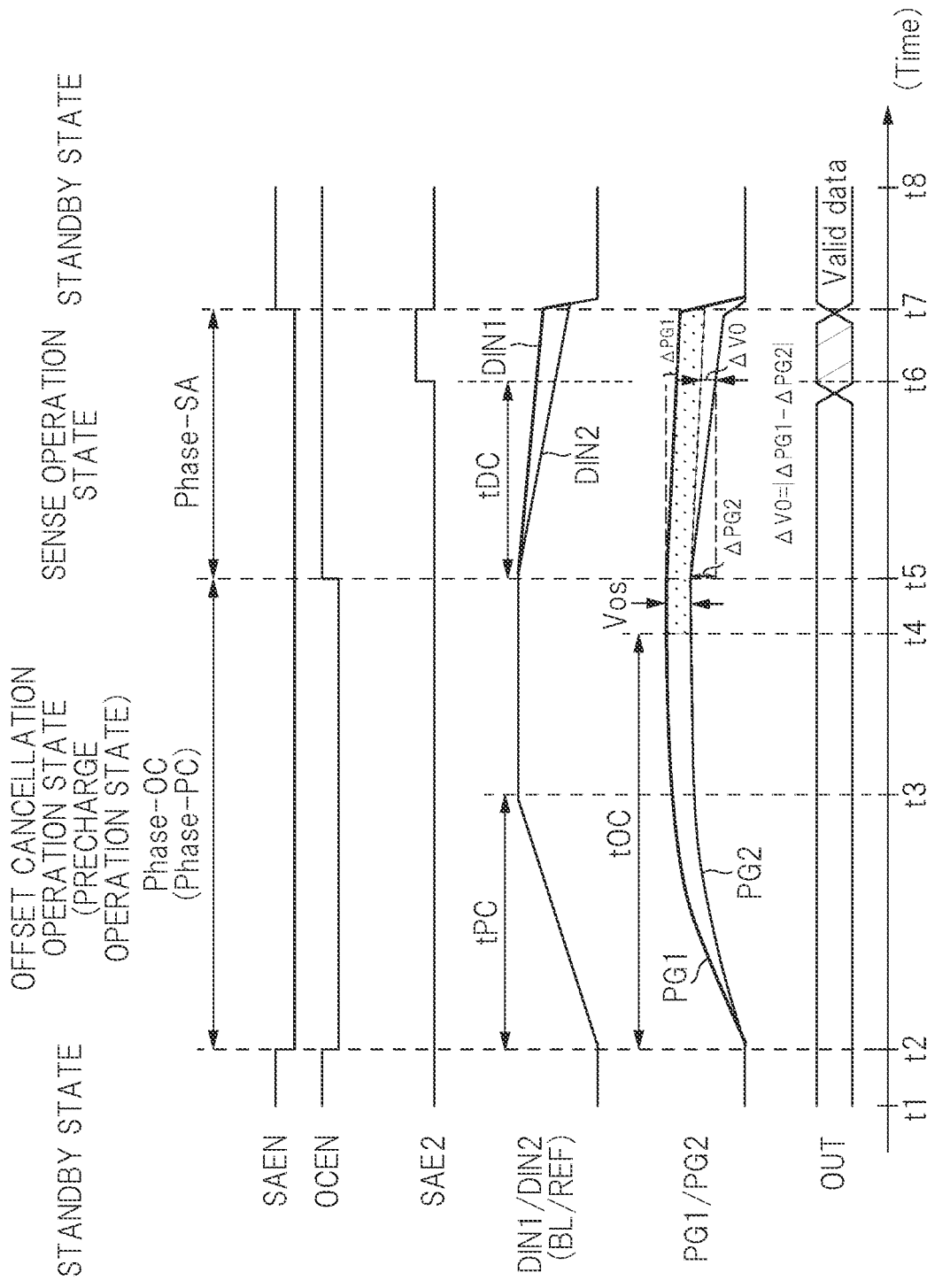
FIG. 3 is a timing chart in the sense amplifier according to the standard technology.

FIG. 3 is a timing chart in the sense amplifier according to the standard technology. The timing chart shows time changes of the levels of the main signals received by the sense amplifier, and time changes of the potentials of the main terminals, nodes or paths in the sense amplifier.

The operation of the sense amplifier 8A according to the standard technology can be divided into an offset cancellation operation, a precharge operation and a sense operation. A part or all of a discharge operation is included in the sense operation. An operation period of the sense amplifier 8A can be divided into an offset cancellation operation period Phase-OC, a precharge operation period Phase-PC, and a sense operation period Phase-SA. Note that a part or all of each of the offset cancellation operation and the precharge operation is performed concurrently with other. Therefore, a part or all of each of the offset cancellation operation period Phase-OC and the precharge operation period Phase-PC overlaps the other. Moreover, a state of the sense amplifier 8A can be divided into a standby state, an offset cancellation operation state, a precharge operation state and a sense operation state.

The offset cancellation operation is an operation to make an advance preparation so that an offset voltage of the sense amplifier 8A is cancelled at the time of the sense operation of the sense amplifier 8A. Specifically, the offset cancellation operation is an operation to charge the capacitors 19 and 20 so that a voltage obtained by converting the offset voltage of the sense amplifier 8A into an input voltage to the data input paths DIN1 and DIN2 is accumulated as a voltage difference in the capacitors 19 and 20. The precharge operation is a preparation operation before performing the sense operation, and is an operation to charge electric charges to the bit line BL and the reference signal line REF, which are connected to the data input paths DIN1 and DIN2, so that the data input paths DIN1 and DIN2 reach a predetermined voltage. Moreover, the sense operation is an operation to compare, with each other, weak signals input to the data input paths DIN1 and DIN2, to amplify a difference therebetween, and to output the amplified difference as a data value readable by an analog circuit.

First, the offset cancellation operation in the offset cancellation operation period Phase-OC is described.

As shown in FIG. 3, a time t1 is a time when the sense amplifier 8A is in a standby state before entering the offset cancellation operation. At the time t1, each of the signal SAEN and the signal OCEN is at the "H" level. Meanwhile, the signal SAE2 is at the "L" level.

At the time t1, since the signal SAEN is at the "H" level, potentials of gates of the PMOS transistors 13 and 14 are at the "H" level, and the PMOS transistors 13 and 14 are "off". Thus, the circuit below the PMOS transistors 13 and 14 is separated from the circuit above the same, and unnecessary current consumption can be reduced. Moreover, since the signal OCEN is at the "H" level, the switches 21 and 22 are "off". Hence, the nodes PG1 and PG2 are in a floating state. Moreover, the PMOS transistors 15 and 16 are "off", and the operation to precharge the data input paths DIN1 and DIN2 with the power supply voltage VDD of the power supply VDD1 is not performed yet.

At a time t2, the signal SAEN and the signal OCEN individually switch from the "H" level to the "L" level, and the signal SAE2 remains at the "L" level. At timing of this time t2, the sense amplifier 8A enters the offset cancellation operation and the precharge operation.

At the time t2, since the signal SAEN is at the "L" level, the potentials of the gates of the PMOS transistors 13 and 14 turn to the "L" level, and the PMOS transistors 13 and 14 turn "on". Thus, the circuit above the PMOS transistors 13 and 14 and the circuit below the same are connected to each other.

It is now possible to supply a current from the path of the power supply VDD1 to the node COM that is a source common to the PMOS transistors 11 and 12. Moreover, since the signal OCEN is at the "L" level, the switches 21 and 22 turn "on". That is, a current flows from the node COM to the capacitor 19 via the PMOS transistor 11, the PMOS transistor 13, the node OT1, the switch 21, and the node PG1, and the capacitor 19 is started to be charged. Moreover, a current flows from the node COM to the capacitor 20 via the PMOS transistor 12, the PMOS transistor 14, the node OT2, the switch 22, and the node PG2, and the capacitor 20 is started to be charged. That is, the offset cancellation operation is started.

The NMOS transistors 17 and 18 form a current mirror configuration. The NMOS transistors 17 and 18 function as a load element pair for causing an output signal pair to appear in the nodes OT1 and OT2. Herein, the output signal pair is obtained by performing differential amplification for an input signal pair of the data input paths DIN1 and DIN2.

Thus, the capacitors 19 and 20 are charged so that a voltage Vos appears as a differential voltage between an inter-terminal voltage of the capacitor 19 and an inter-terminal voltage of the capacitor 20. Herein, the voltage Vos is a voltage obtained by converting the offset voltage of the sense amplifier 8A into the input voltage to the data input paths DIN1 and DIN2. At this time, a path of current supply to the node COM is only the path from the power supply VDD1. The amount of current that can be supplied by the tail current source TCS from the power supply VDD1 is generally small, and in the present embodiment, is limited to the tail current Ibias×100% at most. Following this, charge currents to the capacitors 19 and 20 are also limited, and an offset cancellation time tOC required for the offset cancellation operation tends to be comparatively lengthened.

Moreover, at the time t2, since the signal OCEN is at the "L" level, the PMOS transistors 15 and 16 turn "on", and started is the precharge operation from the power supply VDD2 to the data input paths DIN1 and DIN2 (the bit line BL and the reference signal line REF, which are an external input terminal pair). The potentials of the data input path DIN1 and DIN2 gradually rise from the time t2, and reach a power supply voltage VDD of the power supply VDD2 at a time t3 after the elapse of a precharge time tPC required to precharge the data input paths DIN1 and DIN2.

Hence, in the offset cancellation operation period Phase-OC, not only the offset cancellation operation but also the precharge operation for the data input paths DIN1 and DIN2 is performed concurrently.

A time t4 is a time when the offset cancellation operation is completed. Note that the time t4 can be roughly estimated, for example, by the capacitances of the capacitors 19 and 20, the amount of current supplied from the node COM, resistance components of conduction paths and the like.

Next, the sense operation in the sense operation period Phase-SA is described. A time t5 is set as a time after a predetermined short time elapses from the time t4. At the time t5, the signal OCEN switches from the "L" level to the "H" level, and the signal SAEN remains at the "L" level. Thus, the sense amplifier 8A switches from the offset cancellation 25 operation to the sense operation.

At the time t5, the signal OCEN turns to the "H" level, whereby the PMOS transistors 15 and 16 turn "off". Thus, the paths from the power supply VDD2, that is, paths for use in the precharge to the data input paths DIN1 and DIN2 are blocked. Moreover, at the time t5, since the signal OCEN is at the "H" level, the switches 21 and 22 also turn "off". Thus, the paths through which the capacitors 19 and 20 are charged from the power supply VDD1 are blocked.

When the sense operation starts, electric charges precharged to the data input paths DIN1 and DIN2 are gradually discharged according to readout data, and the potentials of the data input paths DIN1 and DIN2 gradually decrease concurrently therewith. Moreover, potentials of the nodes PG1 and PG2 also decrease due to an influence of coupling with the capacitors 19 and 20.

A time t6 is set at a time after a discharge time tDC elapses from the time t5. Herein, the discharge time tDC is a time considered required to output an accurate signal from the output terminal OUT of the differential amplifier 23. At the time t6, the signal SAE2 switches from the "L" level to the "H" level, and the signal OCEN remains at the "H" level. Thus, the differential amplifier 23 is activated. As a result, the differential amplifier 23 outputs, to the output terminal OUT, a voltage obtained by performing differential amplification for a potential difference between the data input paths DIN1 and DIN2. That is, in the output terminal OUT of the differential amplifier 23, there appears a potential corresponding to data of a memory cell at a selected address.

A time t7 is set as a time after a predetermined short time considered required to determine the output of the output terminal OUT elapses after the time t6. At the time t7, the signal SAEN switches from the "L" level to the "H" level, and the signal SAE2 switches from the "H" level to the "L" level. Thus, gate potentials of the PMOS transistors 13 and 14 turn to the "H" level, and the PMOS transistors 13 and 14 turn "off". Moreover, a potential of the enable terminal of the differential amplifier 23 turns to the "L" level, and the differential amplifier 23 is deactivated. At this time, established is a state in which an accurate signal is output to the output terminal OUT of the differential amplifier 23, and it becomes possible to read the signal of the output terminal OUT, that is, to read the data of the selected memory cell. After the time t7, the sense amplifier 8A returns to the standby state, and prepares for a next data reading operation.

A time t8 is a time after a certain period of time elapses from the time t7. At the time t8, the data input paths DIN1 and DIN2 and the nodes PG1 and PG2 are reset.

According to such a sense amplifier 8A as described above, the capacitors 19 and 20 are charged with the tail current Ibias by the tail current source TCS from the power supply VDD1 so that there appears, as a differential voltage, the voltage Vos obtained by converting the offset voltage of the sense amplifier 8A into the input voltage. Thereafter, in a state in which the offset voltage of the sense amplifier 8A is cancelled by the capacitors 19 and 20, the differential amplification between the signal of the bit line BL and the signal of the reference signal line REF, which are input to the data input paths DIN1 and DIN2, is performed, and the sense operation is achieved.

Moreover, the capacitors 19 and 20 in each of which a charging voltage is continuously variable are provided in order to compensate for the offset voltage of the sense amplifier, and accordingly, accuracy of the offset cancellation is high. Further, by the above-described sense operation, a differential amplification signal between the signal of the bit line BL and the signal of the reference signal line REF appears in the nodes OT1 and OT2, and the signals of the nodes OT1 and OT2 are further subjected to the differential amplification by the differential amplifier 23, and are output. Therefore, a comparative resolution between the signals input to the data input paths DIN1 and DIN2 is high.

However, in general, it is difficult to increase the amount of current, which is supplied from the power supply VDD1, due to a problem of an operating current and from a viewpoint of amplification sensitivity, and the amount of current of the tail current Ibias is limited. Therefore, the offset cancellation time tOC that is a time until the capacitors 19 and 20 are charged tends to be comparatively lengthened, and it takes long to read the data.

First Embodiment

A sense amplifier according to a first embodiment is described. The sense amplifier according to the first embodiment is an example of improving the sense amplifier according to the standard technology. As mentioned above, in the standard technology, there are such advantages that the accuracy of the offset cancellation is high, and that the comparative resolution between the signals input to the data input paths DIN1 and DIN2 is high. Meanwhile, in general, in the configuration of the standard technology, the amount of current supplied from the path of the power supply VDD1 cannot be increased, and the amount of current of the tail current Ibias is limited. Therefore, the offset cancellation time tOC that is a time until the capacitors 19 and 20 are charged tends to be comparatively lengthened, and it takes long to read the data. In this connection, the inventors of the present invention have created a configuration of a sense amplifier, which will be described below, in consideration of such circumstances. The sense amplifier according to the first embodiment is configured so as to increase a charging capacity to the capacitor, to shorten the offset cancellation time tOC so that the offset cancellation time tOC becomes the precharge time tPC or less, and to be capable of achieving the shortening of the entire operation time of the sense amplifier.

Configuration of Sense Amplifier According to First Embodiment

Figure 4:
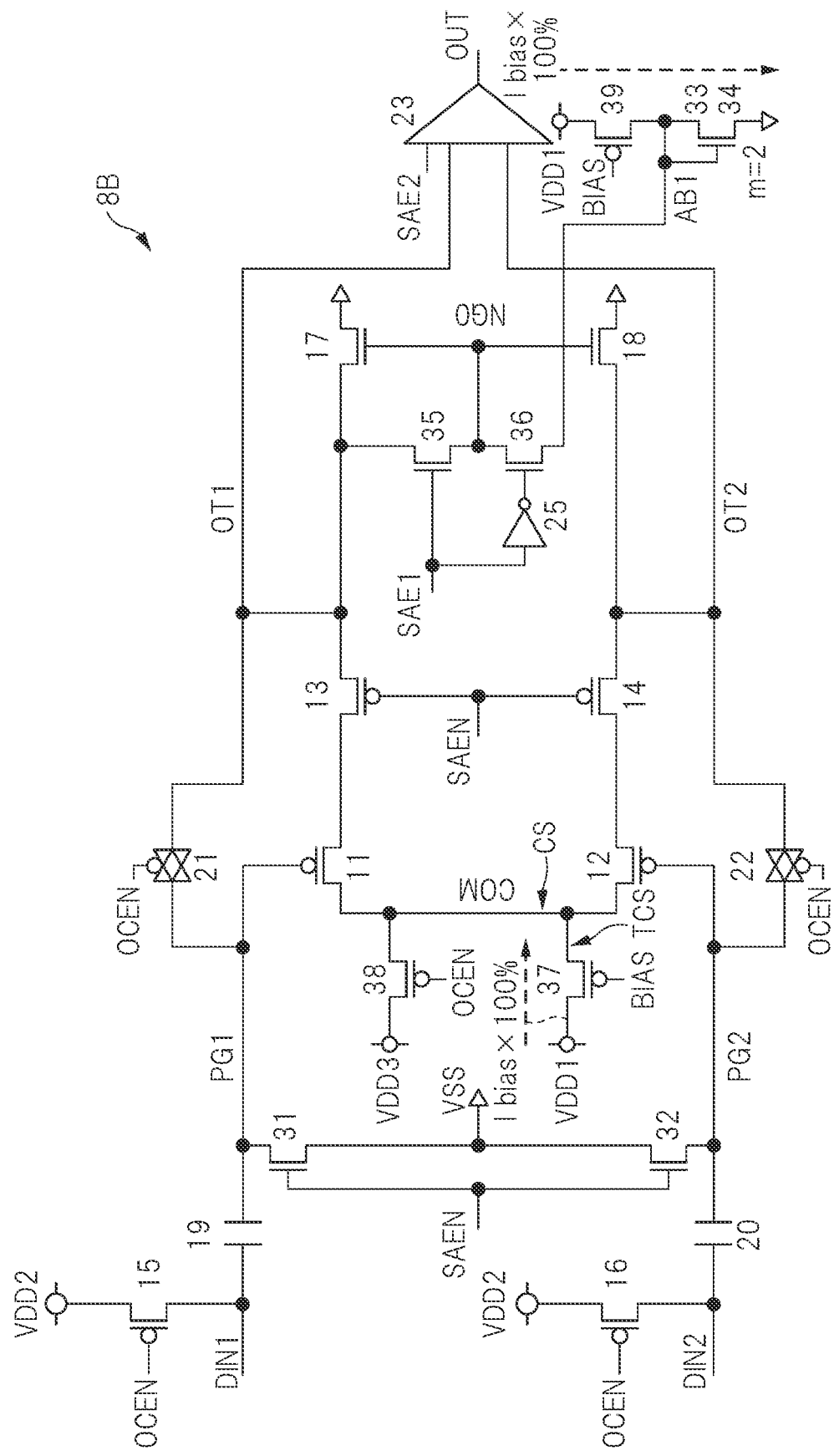
FIG. 4 is a diagram showing a configuration of a sense amplifier according to a first embodiment.

FIG. 4 is a diagram showing a configuration of the sense amplifier according to the first embodiment. The sense amplifier according to the first embodiment is an example of the following "differential amplifier" in the present application.

The differential amplifier is a differential amplifier including: a current source (CS) that is connected to a first power supply (VDD1) in which a suppliable current is a first current (Ibias); an active element pair (PMOS transistors 11, 12) that is connected to the current source, and amplifies a signal input to an input terminal pair (PG1, PG2) to output an output signal pair; a load element pair (NMOS transistors 17, 18) that is connected to a second power supply (VSS) different in power supply voltage from the first power supply, the load element pair serving for outputting the output signal pair to an output terminal pair (OT1, OT2); a capacitance element pair (capacitors 19, 20) that is inserted between an external input terminal pair (DIN1, DIN2) and the input terminal pair; a switching element pair (switches 21, 22) that performs an offset cancellation operation to charge the capacitance element pair such as to cause the capacitance element pair to generate a voltage (Vos) by short-circuiting corresponding terminals between the output terminal pair and the input terminal pair, the voltage (Vos) being obtained by converting an offset voltage of the input terminal pair into an input voltage; and a current control circuit (PMOS transistor 38) that controls a current suppliable by the current source to be a second current (suppliable current of VDD1+suppliable current of VDD3) larger than the first current at a time of performing the offset cancellation operation.

Moreover, the differential amplifier is a differential amplifier further including: a precharge circuit (PMOS transistors 15, 16) that connects a fifth power supply (VDD2) to the external input terminal pair, and precharges the external input terminal pair with a potential of the fifth power supply, wherein the offset cancellation operation is performed in a period (PMOS transistor 38, switches 21, 22, and NMOS transistor 36 are turned on) in a period while a precharge operation is performed (PMOS transistors 15, 16 are turned on) by the precharge circuit, the offset cancellation operation is then stopped (PMOS transistor 38, switches 21, 22, PMOS transistors 15, 16, and NMOS transistor 36 are turned off), after the offset cancellation operation is stopped, the precharge operation is stopped (PMOS transistors 15, 16 are turned off), and a discharge operation of the external input terminal pair is started, and a reading operation of an output based on the output signal pair is enabled to be started.

In comparison with the sense amplifier 8A according to the standard technology, a sense amplifier 8B shown in FIG. 4 is a sense amplifier configured so as to shorten the offset cancellation time tOC that is a time until the capacitors 19 and 20 are charged. In comparison with the sense amplifier 8A, the sense amplifier 8B further includes NMOS transistors 31 to 36, PMOS transistors 38 ad 39, a power supply VDD3 (an example of a "third power supply" in the present application), and an inverter (inversion logic circuit) 25. Note that, in FIG. 4, characteristic current flows are shown by dashed arrows on the configuration diagram of the sense amplifier 8B.

The NMOS transistor 31 is connected between the node PG1 and a path of the power supply VSS, and a gate thereof receives the signal SAEN. The NMOS transistor 32 is connected between the node PG2 and the path of the power supply VSS, and a gate thereof receives the signal SAEN. When the signal SAEN is at the "H" level, the NMOS transistors 31 and 32 (an example of an "initialization circuit" in the present application) turn "on", that is, conduct, and the potentials of the nodes PG1 and PG2 turn to a level of a potential of the power supply VSS (an example of a "second power supply" in the present application), and are initialized. Note that the power supply VSS generally has a power supply voltage lower than the power supply VDD1, and for example, this power supply voltage is a ground voltage of the sense amplifier 8B.

The PMOS transistor 37 is connected between a path of the power supply VDD1 (an example of a "first power supply" in the present application) and a node COM that serves as a current source CS (an example of a "current source" in the present application), and a gate thereof receives a signal BIAS. When the signal BIAS is at the "L" level, the PMOS transistor 37 turns "on", that is, conducts, and the power supply VDD1 is connected to the node COM. The PMOS transistor 38 is connected between the power supply VDD3 different from the power supply VDD1 and the node COM, and a gate thereof receives the signal OCEN. When the signal OCEN is at the "L" level, the PMOS transistor 38 turns "on", that is, conducts, and the power supply VDD3 is connected to the node COM. That is, when the signal BIAS is at the "L" level, and the signal OCEN is at the "L" level, not only the path from the power supply VDD1 but also a path from the power supply VDD3 is added as the current supply path to the node COM.

Note that, in the present embodiment, the current from the path of the power supply VDD1 is limited to the tail current Ibias×100% at most by setting the signal BIAS at a potential between the "H" level and the "L" level. Meanwhile, the power supply VDD3 can flow a current larger than the power supply VDD1. For example, the power supply VDD3 has the same power supply voltage as that of the power supply VDD1, and further, can flow a current that is the tail current Ibias×300% or more.

The PMOS transistor 39 and a parallel circuit (an example of an "element pair through which a current flows" in the present application) of the NMOS transistors 33 and 34 are connected in series to each other between the path of the power supply VDD1 and a path of the power supply VSS. A gate of the PMOS transistor 39 receives the signal BIAS. Gates of the NMOS transistors 33 and 34 are connected to a node AB1 that is a node between the PMOS transistor 39 and the parallel circuit of the NMOS transistors 33 and 34.

When the signal BIAS switches from the "H" level to the level between the "H" and "L", the PMOS transistor 39 and the parallel circuit of the NMOS transistors 33 and 34 turn on. Thus, a current starts to flow from the power supply VDD1 through the PMOS transistor 39 and the parallel circuit of the NMOS transistors 33 and 34, and the node AB1 maintains such a fixed potential at which the saturated tail current Ibias flows.

When the signal BIAS switches from the level between "H" and "L" to the "H" level, the PMOS transistor 39 and the parallel circuit of the NMOS transistors 33 and 34 turn "off". Thus, the current that flows through the PMOS transistor 39 and the parallel circuit of the NMOS transistors 33 and 34 decreases, and finally becomes zero.

A node between the gate of the NMOS transistor 17 and the gate of the NMOS transistor 18 is the node NGO. The NMOS transistor 35 is connected between the node OT1 and the node NGO, and a gate thereof receives a signal SAE1. The NMOS transistor 36 is connected between the node NGO and the node AB1, and a gate thereof receives a signal obtained by inverting the signal SAE1 by the inverter 25. When the signal SAE1 turns to the "H" level, the NMOS transistor 35 turns "on", and the NMOS transistor 36 turns "off", and therefore, the node NGO and the node OT1 are connected to each other. Thus, the NMOS transistors 17 and 18 which are N-channel pair transistors form a current mirror circuit.

Meanwhile, when the signal SAE1 turns to the "L" level, the NMOS transistor 35 turns "off", and the NMOS transistor 36 turns "on", and therefore, the node NGO and the node AB1 are connected to each other. Thus, the NMOS transistors 17 and 18 constitute a current mirror circuit together with the parallel circuit of the NMOS transistors 33 and 34.

As descried above, the NMOS transistors 35 and 36 and the inverter 25 constitute a load control circuit (an example of a "load control circuit" in the present application) that switches between the configurations of the current mirror circuit of the NMOS transistors 17 and 18 by switching between connection destinations of the gates of the NMOS transistors 17 and 18 which are a load element pair.

Operation of Sense Amplifier According to First Embodiment

An operation of the sense amplifier 8B according to a first embodiment is described.

Figure 5:
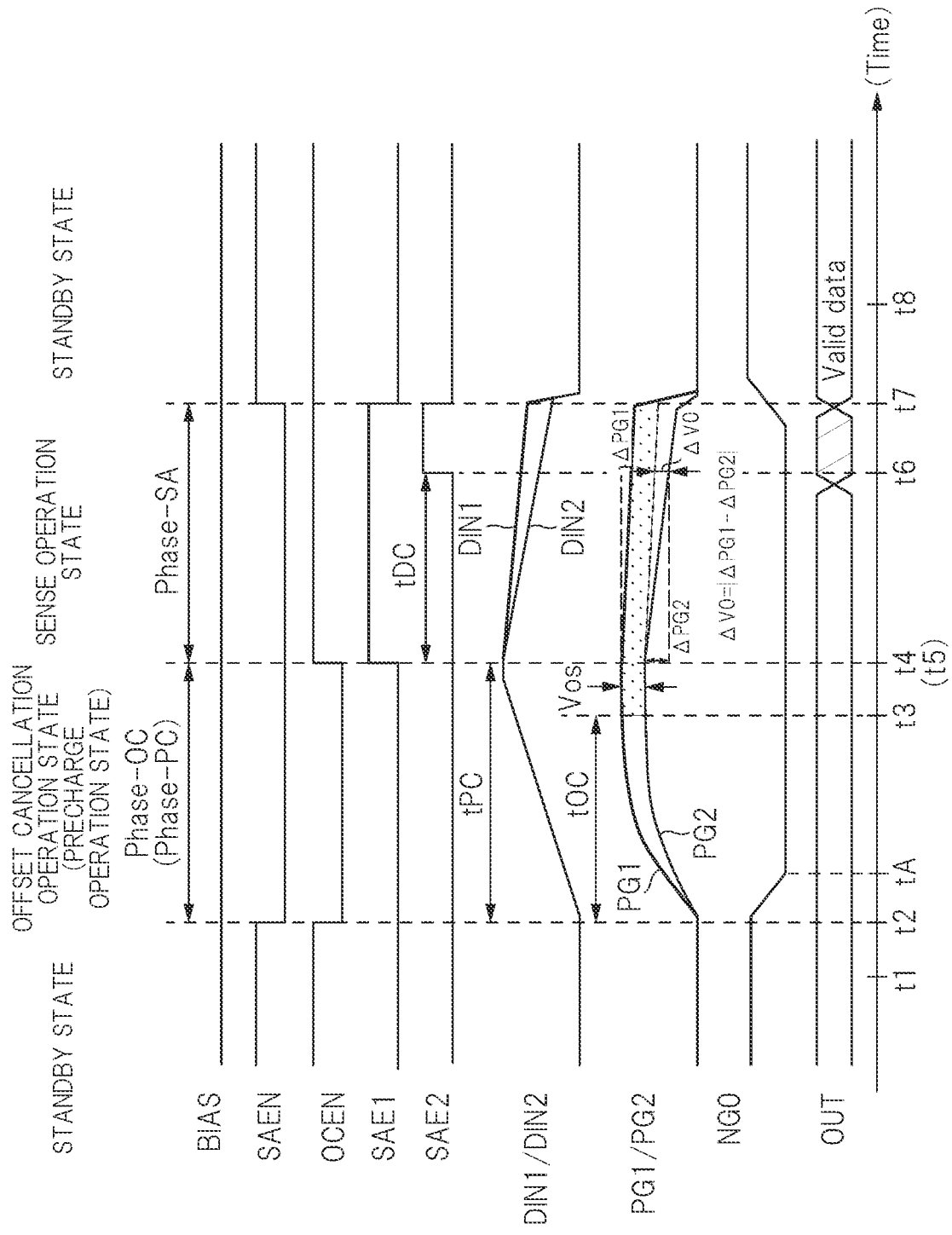
FIG. 5 is a timing chart in the sense amplifier according to the first embodiment.

FIG. 5 is a timing chart in the sense amplifier according to the first embodiment.

The operation of the sense amplifier 8B according to the first embodiment can be divided into an offset cancellation operation, a precharge operation and a sense operation. A part or all of a discharge operation is included in the sense operation. An operation period of the sense amplifier 8B can be divided into an offset cancellation operation period Phase-OC, a precharge operation period Phase-PC, and a sense operation period Phase-SA. Note that a part or all of each of the offset cancellation operation and the precharge operation is performed concurrently with other. Therefore, a part or all of each of the offset cancellation operation period Phase-OC and the precharge operation period Phase-PC overlaps the other.

Moreover, a state of the sense amplifier 8B can be divided into a standby state, an offset cancellation operation state, a precharge operation state and a sense operation state. Moreover, the state of the sense amplifier 8B switches in order of the standby state, the offset cancellation operation state (precharge operation state), the sense operation state, and the standby state. The switching between these states is controlled by switching timing between "H" and "L" of each signal output from the timing controller (an example of a "state control 20 circuit" in the present application) 6.

The offset cancellation operation is an operation to make an advance preparation so that an offset voltage of the sense amplifier 8B is cancelled at the time of the sense operation of the sense amplifier 8B. Specifically, the offset cancellation operation is an operation to charge the capacitors 19 and 20 so that a voltage obtained by converting the offset voltage of the sense amplifier 8B into an input voltage to the data input paths DIN1 and DIN2 is accumulated as a voltage difference in the capacitors 19 and 20. The precharge operation is a preparation operation before performing the sense operation, and is an operation to charge electric charges to these paths so that the data input paths DIN1 and DIN2 reach a predetermined voltage. Moreover, the sense operation is an operation to compare, with each other, weak signals input to the data input paths DIN1 and DIN2, to amplify a difference therebetween, and to output the amplified difference as a data value readable by an analog circuit.

First, the offset cancellation operation in the offset cancellation operation period Phase-OC is described.

As shown in FIG. 5, a time t1 is a time in a standby state before entering the offset cancellation operation. At the time t1, the signal SAEN and the signal OCEN are individually at the "H" level, and the signal SAE1 and the signal SAE2 are individually at the "L" level. Note that the signal BIAS remains at the level between "H" and "L" during a period of repeating the data reading.

At the time t1, since the signal SAEN is at the "H" level, potentials of gates of the PMOS transistors 13 and 14 are at the "H" level, and the PMOS transistors 13 and 14 are "off". When the PMOS transistors 13 and 14 are "off" and do not conduct, the circuit below the PMOS transistors 13 and 14 is separated, and unnecessary current consumption can be reduced. Moreover, since the signal SAEN is at the "H" level, potentials of gates of the NMOS transistors 31 and 32 are at the "H" level, and the NMOS transistors 31 and 32 are "on". Moreover, since the signal OCEN is at the "H" level, the switches 21 and 22 are "off". Hence, potentials of the nodes PG1 and PG2 are at a level of a potential of the power supply VSS, and are in an initialized state. Moreover, since the signal OCEN is at the "H" level, the PMOS transistors 15 and 16 are "off", and the operation to precharge the data input paths DIN1 and DIN2 with the power supply voltage of the power supply VDD2 is not performed.

Herein, the potentials of the nodes PG1 and PG2 are initialized to the level of the potential of the power supply VSS. Therefore, the PMOS transistors 11 and 12 are "on", and this leads to an effect of preventing a block of the current flows through the PMOS transistors 11 and 12 when the process shifts to the subsequent offset cancellation operation.

At a time t2, the signal SAE1 and the signal SAE2 individually remain at the "L" level, but the signal SAEN and the signal OCEN individually switch from the "H" level to the "L" level. Thus, the sense amplifier 8B enters the offset cancellation operation and the precharge operation.

Figure 6:
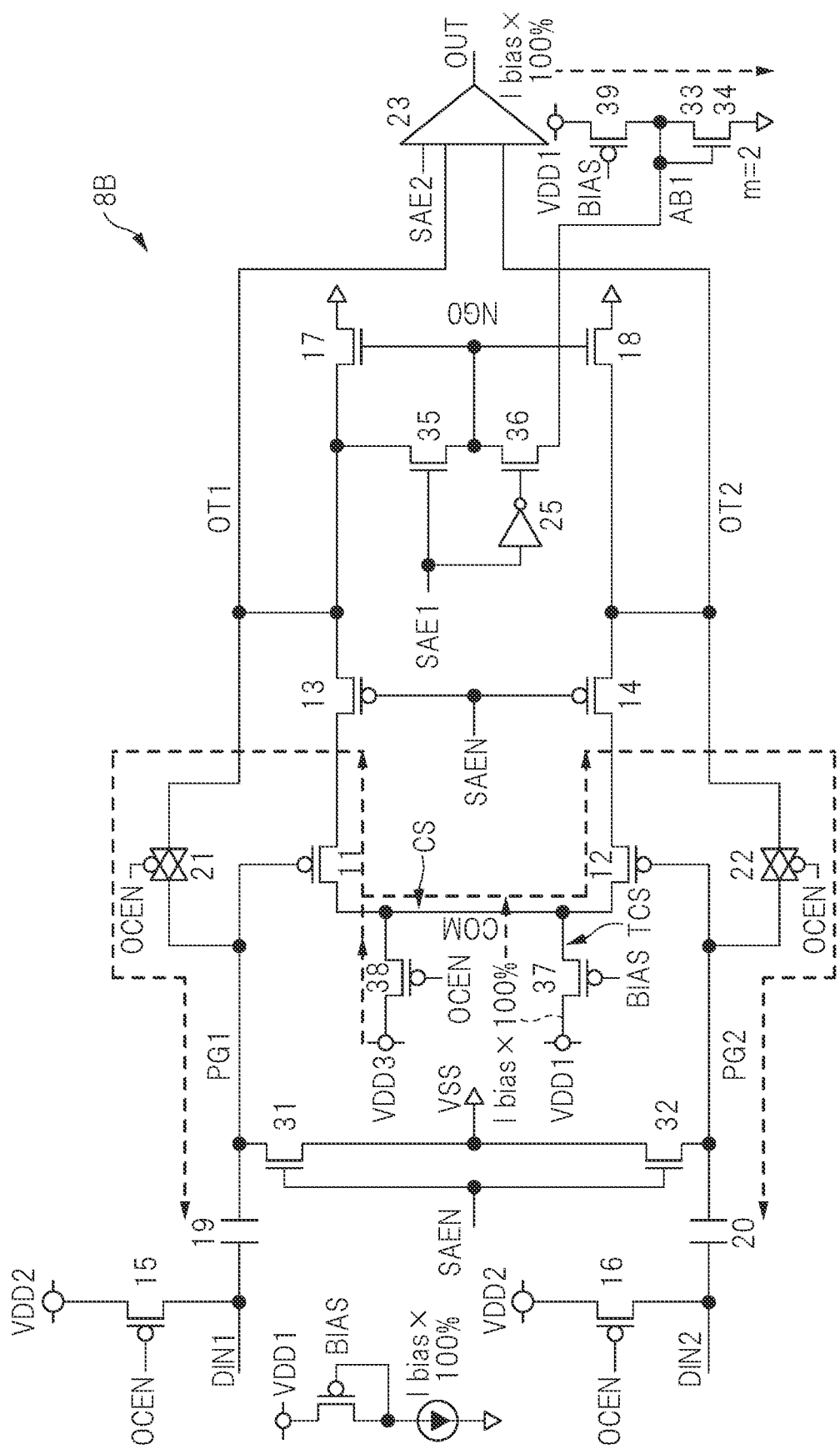
FIG. 6 is a diagram for explaining an offset cancellation operation.

FIG. 6 is a diagram for explaining the offset cancellation operation. Note that, in FIG. 6, characteristic current flows are shown by dashed arrows on the configuration diagram of the sense amplifier 8B. At the time t2, since the signal SAEN is at the "L" level, the potentials of the gates of the NMOS transistors 31 and 32 turn to the "L" level, and the NMOS transistors 31 and 32 turn "off". Potentials of the gates of the PMOS transistors 13 and 14 turn to the "L" level, and the PMOS transistors 13 and 14 turn "on". Since the signal SAE1 is at the "L" level, the potential of the gate of the NMOS transistor 35 is at the "L" level, and the NMOS transistor 35 turns "off". Meanwhile, the potential of the gate of the NMOS transistor 36 is at the "H" level, and the NMOS transistor 26 turns "on". That is, the node NGO is connected to the node AB1.

Moreover, since the signal BIAS is at the level between "H" and "L", the PMOS transistor 39 and the parallel circuit of the NMOS transistors 33 and 34 turn on. At the point of time of a time tA after a current starts to flow from the power supply VDD1, the node AB1, that is, the node NGO maintains such a fixed potential at which the saturated current Ibias flows.

Further, since the signal OCEN is at the "L" level, the switches 21 and 22 turn "on". That is, a current flows from the node COM, which is a source supply common to the PMOS transistors 11 and 12, via the PMOS transistor 11 and the switch 21 to the node PG1, and the capacitor 19 is charged. Moreover, a current flows from the node COM via the PMOS transistor 12 and the switch 22 to the node PG2, and the capacitor 20 is charged.

When the capacitors 19 and 20 are charged as described above, the capacitors 19 and 20 are charged so that a voltage Vos, which is obtained by converting the offset voltage of the sense amplifier 8B to the input voltage, appears as a differential voltage between an inter-terminal voltage of the capacitor 19 and an inter-terminal voltage of the capacitor 20. At this time, not only the path that passes from the power supply VDD1 through the PMOS transistor 37 but also the path that passes from the power supply VDD3 through the PMOS transistor 38 is added as the current supply path to the node COM. Hence, charge currents to the capacitors 19 and 20 increase, and the capacitors 19 and 20 are charged at a higher speed, thus making it possible to shorten the offset cancellation time tOC required for the offset cancellation.

Moreover at this time, the potentials of the nodes PG1 and PG2 are initialized to the level of the potential of the power supply VSS. Therefore, there is an effect of preventing a block of the current flows through the PMOS transistors 11 and 12 when the process shifts to the subsequent offset cancellation operation. That is, this operation contributes to further shortening of the offset cancellation time tOC.

Moreover, the NMOS transistors 17 and 18 constitute a current mirror circuit together with the parallel circuit of the NMOS transistors 33 and 34. This configuration has a function to match, with each other, operating points of the NMOS transistors 17 and 18 in the sense operation period after the offset cancellation operation period. Moreover, the sum of currents flowing through the NMOS transistors 17 and 18 are set so as to be equal (for example, 50% to 150% of Ibias) to the tail current Ibias from the power supply VDD1.

By making such setting, the currents flowing through the PMOS transistors 11 and 12 at the time of the offset cancellation operation completion state at the time t3 and the currents flowing through the PMOS transistors 11 and 12 at the time of the sense operation state can be controlled equally to each other. The currents flowing through the PMOS transistors 11 and 12 at the time of the offset cancellation operation completion state and the currents flowing through the PMOS transistors 11 and 12 at the time of the sense operation state are controlled equally to each other, thus making it possible to perform the offset cancellation with high accuracy.

Note that a mirror ratio of this current mirror is set so that currents as 50% of the tail current Ibias flow through the NMOS transistors 17 and 18. In the present embodiment, for the NMOS transistors 17 and 18, a transistor size of these pair transistors is individually set so that the currents as 50% of the tail current Ibias flow therethrough.

Figure 7:
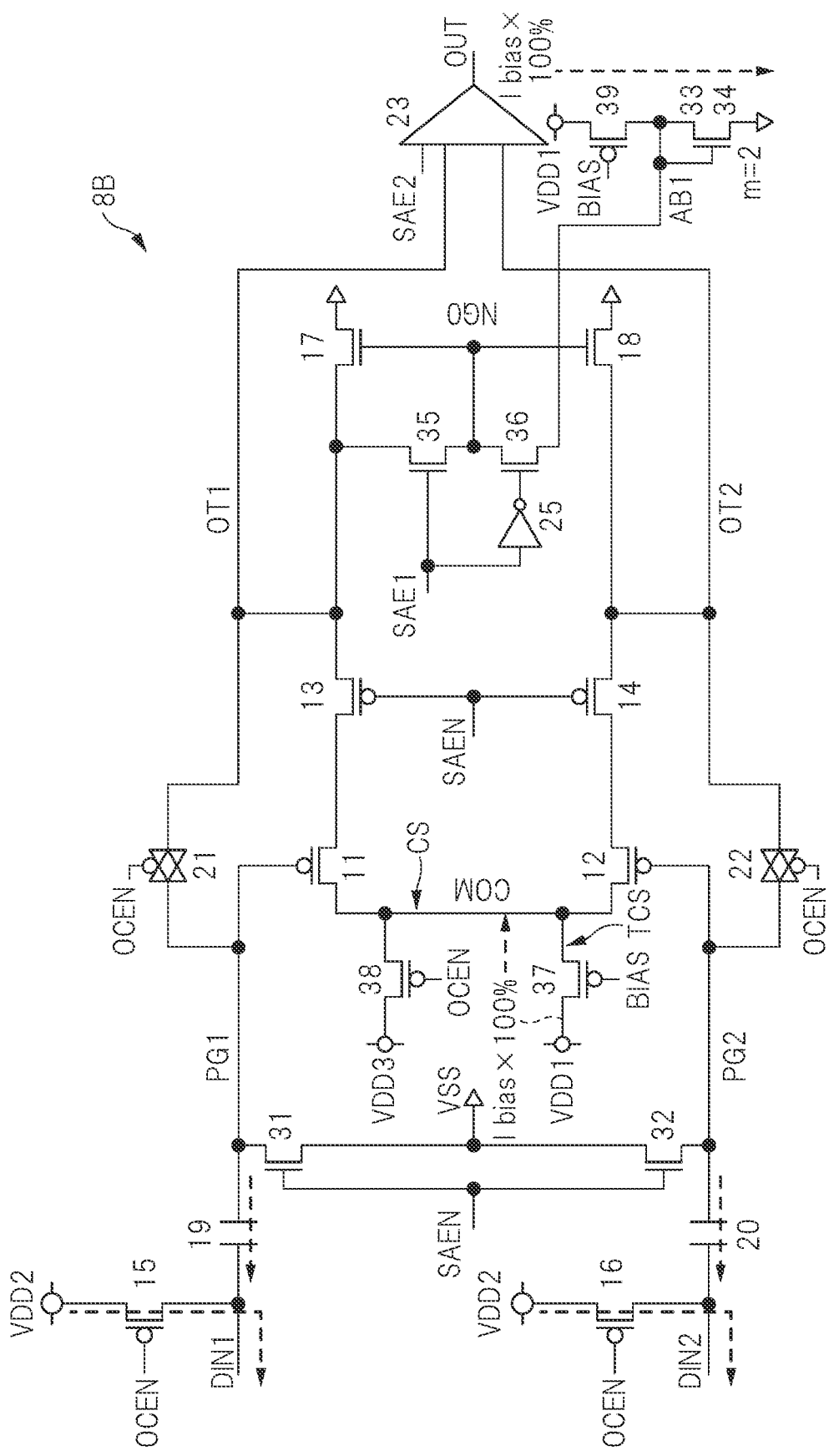
FIG. 7 is a diagram for explaining a precharge operation.

FIG. 7 is a diagram for explaining the precharge operation. Note that, in FIG. 7, characteristic current flows are shown by dashed arrows on the configuration diagram of the sense amplifier 8B.

The PMOS transistors 15 and 16 turn "on", the data input paths DIN1 and DIN2 are precharged from the power supply VDD1, and the potentials of the data input paths DIN1 and DIN2 gradually rise from the time t2, and reach the power supply voltage VDD of the power supply VDD2 at the time t3 after the elapse of the precharge time tPC.

Hence, in the offset cancellation operation period, not only the offset cancellation operation, but also concurrently performed are the precharge operation for the data input paths DIN1 and DIN2 and the operation of matching the operating points of the NMOS transistors 17 and 18 with each other in the sense operation period. Moreover, the currents flowing through the capacitors 19 and 20 by the offset cancellation operation also flow through the data input paths DIN1 and DIN2 via the capacitors 19 and 20. Therefore, the offset cancellation operation supports the precharge operation, and the precharge time tPC required for the precharge is further shortened. As described above, according to the sense amplifier 8B, an extremely efficient operation is performed.

Next, the sense operation in the sense operation period Phase-SA is described. As shown in FIG. 5, at the time t4, the signal OCEN and the signal SAE1 individually switch from the "L" level to the "H" level, the signal SAEN and the signal SAE2 individually remain at the "L" level, and the signal BIAS remains at the level between "H" and "L". According to the levels of these signals, the sense amplifier 8B switches from the offset cancellation operation to the sense operation.

Note that timing of the time t4 is set to a time when there elapses, from the time t2, the precharge time tPC required to complete the precharge to the data input paths DIN1 (bit line BL) and DIN2 (reference signal line REF). Moreover, the amount of current by the path via the PMOS transistor 38 is adjusted, whereby it is possible to reduce the time required for the offset cancellation, that is, the offset cancellation time tOC required until the charge of the capacitors 19 and 20 is completed to equal to or less than the precharge time tPC required for the precharge (tOC≤tPC). Therefore, in the time since the offset cancellation operation is started until the sense operation is started, the precharge time tPC becomes dominant.

Figure 8:
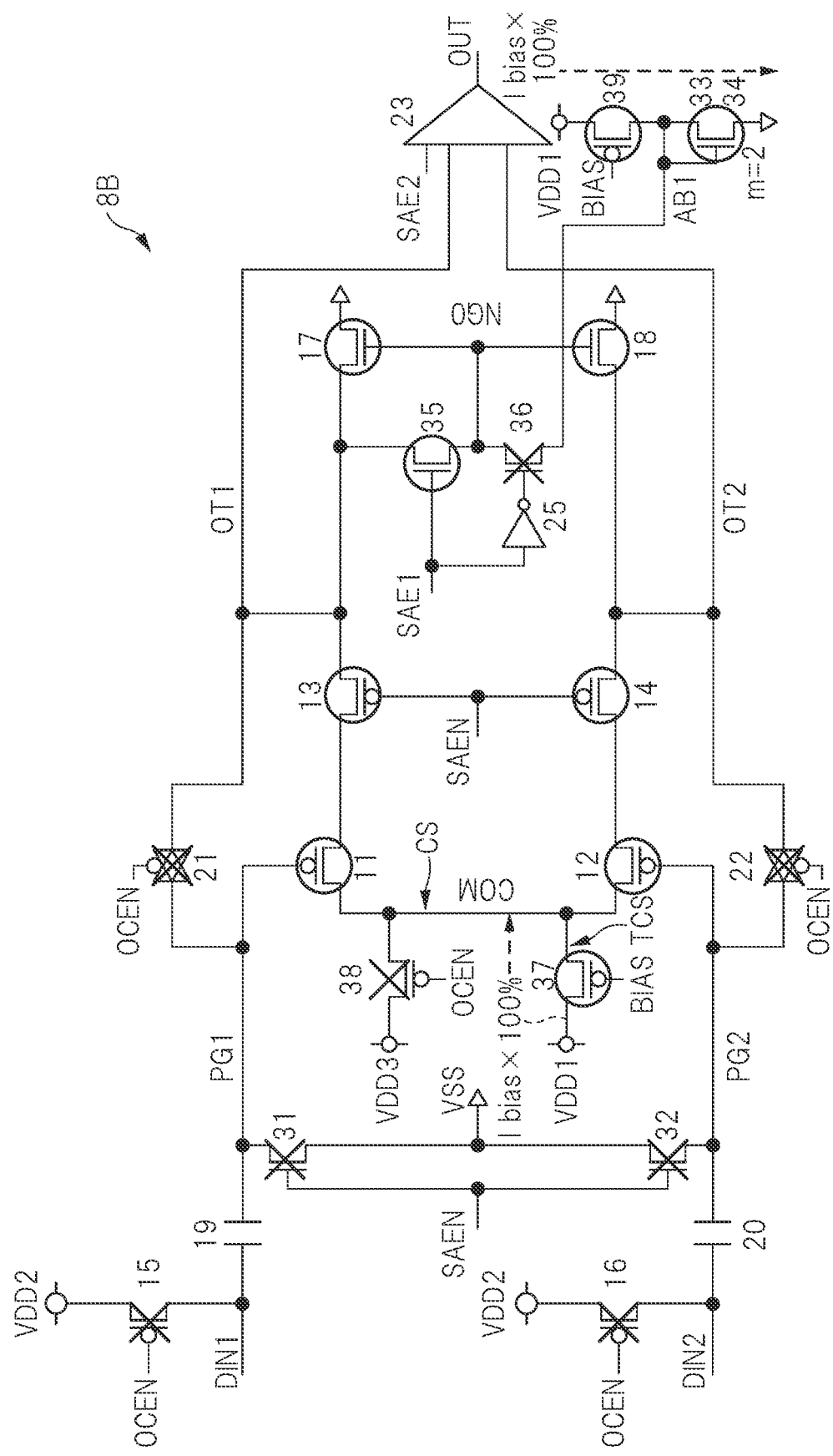
FIG. 8 is a diagram for explaining a sense operation.

FIG. 8 is a diagram for explaining the sense operation. Note that, in FIG. 8, on the configuration diagram of the sense amplifier 8B, activated elements are denoted by circle marks, deactivated elements are denoted by cross marks, and characteristic current flows are shown by dashed arrows.

At the time t4 (the time t5), the signal OCEN turns to the "H" level, whereby, as shown in FIG. 8, the PMOS transistors 15 and 16 turn "off", and the paths from the power supply VDD2 to the data input paths DIN1 and DIN2 are blocked. Moreover, the PMOS transistor 38 turns "off", and the path from the power supply VDD3 to the node COM that is a current supply source is blocked. Thus, the supplied current to the node COM that serves as the current source CS is only the tail current Ibias by the tail current source TCS that passes from the power supply VDD1 through the PMOS transistor 37. Further, the switches 21 and 22 also turn "off". With such a connection configuration, the paths through which the capacitors 19 and 20 are charged with electric charges from the power supply VDD3 are blocked.

Moreover, by the fact that the signal SAE1 turns to the "H" level, the NMOS transistor 35 turns "on", and the NMOS transistor 36 turns "off", and therefore, the NMOS transistors 17 and 18 which are N-channel-side pair transistors form a current mirror configuration with the node OT1 set to a gate potential. With the above-described connection configuration, the sense amplifier 8B forms a circuit configuration equal to that of the sense amplifier 8A that is a differential sense amplifier. With such a connection configuration, enabled is a sense operation in a state in which the voltage Vos in the Offset cancellation operation period Phase-OC is already added. That is, in the sense amplifier 8B a highly accurate sense operation is enabled while ensuring the offset cancellation effect.

When the sense operation starts, electric charges precharged to the data input paths DIN1 and DIN2 are gradually discharged according to readout data, and the potentials of the data input paths DIN1 and DIN2 gradually decrease concurrently therewith. Moreover, potentials of the nodes PG1 and PG2 also decrease due to an influence of coupling with the capacitors 19 and 20.

As shown in FIG. 5, the time t6 is a time after the discharge time tDC of the data input paths DIN1 and DIN2 elapses from the time t4. At the time t6, the signal SAE2 switches from the "L" level to the "H" level, the signal SAEN and the signal BIAS remain at the "L" level, and the signal OCEN and the signal SAE1 remain at the "H" level. By such levels of the signals, the enable terminal of the differential amplifier 23 turns to the "L" level, and the differential amplifier 23 is activated. As a result, the differential amplifier 23 outputs, to the output terminal OUT, a voltage obtained by performing differential amplification for a potential difference between the data input paths DIN1 and DIN2. That is, in the output terminal OUT of the differential amplifier 23, there appears a potential corresponding to data of a memory at a selected address.

A time t7 is set to a time when a time considered necessary for the output of the differential amplifier 23 to be stabilized elapses from the time t6. At the time t7, the signal SAEN and the signal BIAS switch from the "L" level to the "H" level, the signal OCEN remains at the "H" level, and the signal SAE1 and the signal SAE2 switch from the "H" level to the "L" level. Thus, the sense operation is finished. In the output terminal OUT of the differential amplifier 23, there definitely appears a potential corresponding to data of a memory cell at a selected address. Thereafter, data reading is performed in a device connected to the output terminal OUT of the differential amplifier 23. After the time t7, the sense amplifier 8A returns to the standby state, and prepares for a next data reading operation.

A time t8 is a time after a certain period of time elapses from the time t7. At the time t8, the data input paths DIN1 and DIN2 and the nodes PG1 and PG2 are reset.

According to such a sense amplifier 8B as described above, the capacitors 19 and 20 are charged with flows of currents from the node COM that is a current supply source so that there appears, as a differential voltage, the voltage Vos obtained by converting the offset voltage of the sense amplifier 8A into the input voltage. At this time, the node COM is supplied with currents not only from the path from the power supply VDD1 but also from the power supply VDD3. That is, the amount of current suppliable from the node COM to the capacitors 19 and 20 can be increased to more than the tail current Ibias suppliable by the power supply VDD1. By such an increase of the supply current, the capacitors 19 and 20 can be charged at a higher speed, and it becomes possible to largely shorten the offset cancellation time tOC. Note that, preferably, the amount of current suppliable by the power supply VDD3 is larger than the current suppliable by the power supply VDD1.

Electric charges precharged to the data input paths DIN1 and DIN2 are gradually discharged according to readout data, and the potentials of the data input paths DIN1 and DIN2 gradually decrease concurrently therewith. Moreover, potentials of the nodes PG1 and PG2 also decrease due to an influence of coupling with the capacitors 19 and 20.

Moreover, the capacitors 19 and 20 in each of which a charging voltage is continuously variable are provided in order to compensate for the offset voltage of the sense amplifier, and accordingly, accuracy of the offset cancellation is high. Further, by the above-described sense operation, a differential amplification signal between the signal of the bit line BL and the signal of the reference signal line REF appears in the nodes OT1 and OT2, and the signals of the nodes OT1 and OT2 are further subjected to the differential amplification by the differential amplifier 23, and are output. Therefore, a comparative resolution between the signals input to the data input paths DIN1 and DIN2 is high.

As described above, while suppressing the influence of the offset voltage of the sense amplifier by the offset cancellation mechanism, the sense amplifier 8B according to the first embodiment becomes able to shorten the offset cancellation time tOC, and further, to shorten the precharge time tPC, and can achieve the speed enhancement of the data reading.

Second Embodiment

A sense amplifier according to a second embodiment is described. The sense amplifier according to the second embodiment is an example of improving the sense amplifier according to the first embodiment. The sense amplifier according to the second embodiment has a configuration suitable for a case where the offset cancellation time tOC becomes longer than the precharge time tPC. Specifically, the sense amplifier according to the second embodiment is configured so that the shortening of the entire operation time of the sense amplifier can be achieved by stopping the precharge operation and starting the discharge operation before the offset cancellation operation is completed.

Configuration of Sense Amplifier According to Second Embodiment

Figure 9:
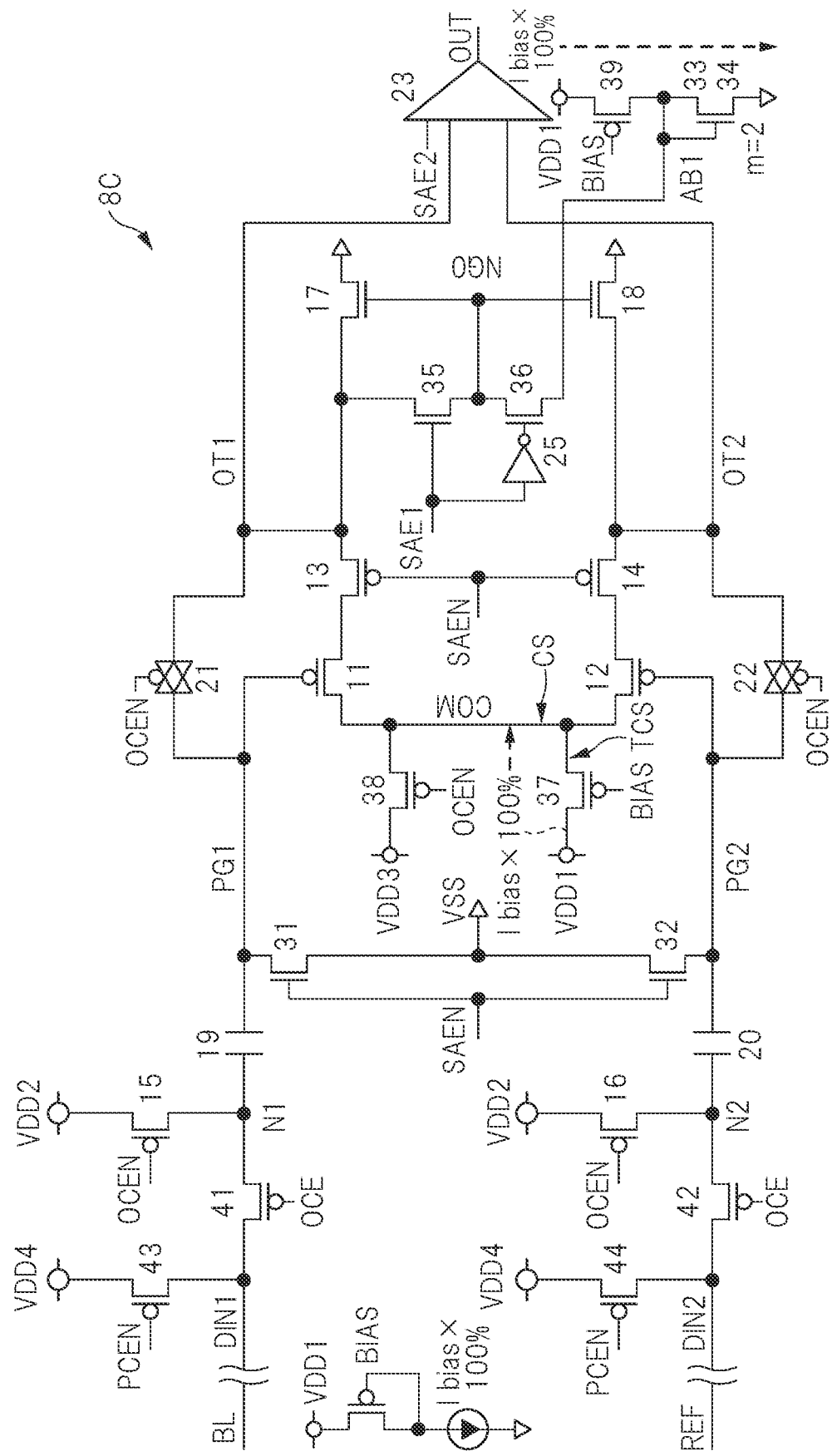
FIG. 9 is a diagram showing a configuration of a sense amplifier according to a second embodiment.

FIG. 9 is a diagram showing a configuration of the sense amplifier according to the second embodiment. The sense amplifier according to the second embodiment is an example of the following "differential amplifier" in the present application.

The differential amplifier is a differential amplifier including: a current source (CS) that is connected to a first power supply (VDD1) in which a suppliable current is a first current (Ibias); an active element pair (PMOS transistors 11, 12) that is connected to the current source, and amplifies a signal input to an input terminal pair (PG1, PG2) to output an output signal pair; a load element pair (NMOS transistors 17, 18) that is connected to a second power supply (VSS) different in power supply voltage from the first power supply, the load element pair serving for outputting the output signal pair to an output terminal pair (OT1, OT2); a capacitance element pair (capacitors 19, 20) that is inserted between an external input terminal pair (DIN1, DIN2) and the input terminal pair; a switching element pair (switches 21, 22) that performs an offset cancellation operation to charge the capacitance element pair such as to cause the capacitance element pair to generate a voltage (Vos) by short-circuiting corresponding terminals between the output terminal pair and the input terminal pair, the voltage (Vos) being obtained by converting an offset voltage of the input terminal pair into an input voltage; and a current control circuit (PMOS transistor 38) that controls a current suppliable by the current source to be a second current (suppliable current of VDD1+suppliable current of VDD3) larger than the first current at a time of performing the offset cancellation operation.

Moreover, the differential amplifier is a differential amplifier further including a precharge circuit (PMOS transistors 15, 16, 41, 44) that connects a fifth power supply (VDD2) to the external input terminal pair, and precharges the external input terminal pair with a potential of the fifth power supply, wherein the offset cancellation operation is performed (PMOS transistor 38, switches 21, 22, and NMOS transistor 36 are turned on, NMOS transistor 35 is turned off) in a period while a precharge operation is performed (PMOS transistors 15, 16, 43, 44 are turned on, PMOS transistors 41, 42 are turned off) by the precharge circuit, in a period of the offset cancellation operation, the precharge operation is stopped (PMOS transistors 43, 44 are turned off), and a discharge operation of the external input terminal pair is started, and after the discharge operation is started, the offset cancellation operation is stopped (PMOS transistor 38, switches 21, 22, PMOS transistors 15, 16, and NMOS transistor 36 are turned off, PMOS transistors 41, 42, and NMOS transistor 35 are turned on), and a reading operation of an output based on the output signal pair is enabled to be started.

Further, the precharge circuit includes: a second switching element pair (PMOS transistors 41, 42) connected between the capacitance element pair and the external input terminal pair; a third switching element pair (PMOS transistors 15, 16) connected between the fifth power supply and a node pair between the capacitance element pair and the second switching element pair; and a fourth switching element pair (PMOS transistors 43, 44) connected between a sixth power supply and a node pair between the second switching element pair and the external input terminal pair, wherein the precharge operation is stopped and the discharge operation is started by shifting a state from a state in which the second switching element pair is deactivated and the third and fourth switching element pairs are activated to a state in which the fourth switching element pair is deactivated.

In comparison with the sense amplifier 8B according to the first embodiment, the sense amplifier 8C shown in FG. 9 is a sense amplifier configured so that a part of the offset cancellation operation can be performed concurrently with the discharge operation. With such a configuration, the entire operation time of the sense amplifier can be shortened even if the current Ibias from the path that passes through the PMOS transistor 37 cannot be increased and it is assumed that the offset cancellation is completed later than the precharge. In comparison with the sense amplifier 8B, the sense amplifier 8C further includes PMOS transistors 41 to 44, and a power supply VDD4 (an example of a "sixth power supply" in the 20) present application).

The PMOS transistor 41 is connected between the data input path DIN1 and the capacitor 19, and a gate thereof receives an inverted signal OCE of the signal OCEN. The PMOS transistor 42 is connected between the data input path DIN2 and the capacitor 20, and a gate thereof receives an inverted signal OCE of the signal OCEN. A node N1 is a node between the PMOS transistor 15 and the capacitor 19. A node N2 is a node between the PMOS transistor 16 and the capacitor 20. The PMOS transistor 43 is connected between the power supply VDD4 and the node DIN1, and a gate thereof receives a signal PCEN. The PMOS transistor 44 is connected between the power supply VDD4 and the node DIN2, and a gate thereof receives the signal PCEN.

When both of signal OCEN and the signal PCEN are at the "L" level, the offset cancellation operation that is a charging operation for the capacitors 19 and 20 and the precharge operation for the bit line BL-side path and the reference signal line REF-side path are performed concurrently with each other.

At timing when the precharge is considered to be completed, the signal PCEN is switched to the "H" level while leaving the signal OCEN at the "L" level. Then, the PMOS transistors 43 and 44 turn "off", the precharge operation stops, and the discharge operation for the bit line BL-side path and the reference signal line REF-side path is started. Thereafter, at timing when the offset cancellation is also considered to be completed, the signal OCEN is switched to the "H" level. Thus, the PMOS transistors 15 and 16 also turn "off", and the offset cancellation operation also stops.

Operation of Sense Amplifier According to Second Embodiment

An operation of the sense amplifier 8C according to the second embodiment is described.

Figure 10:
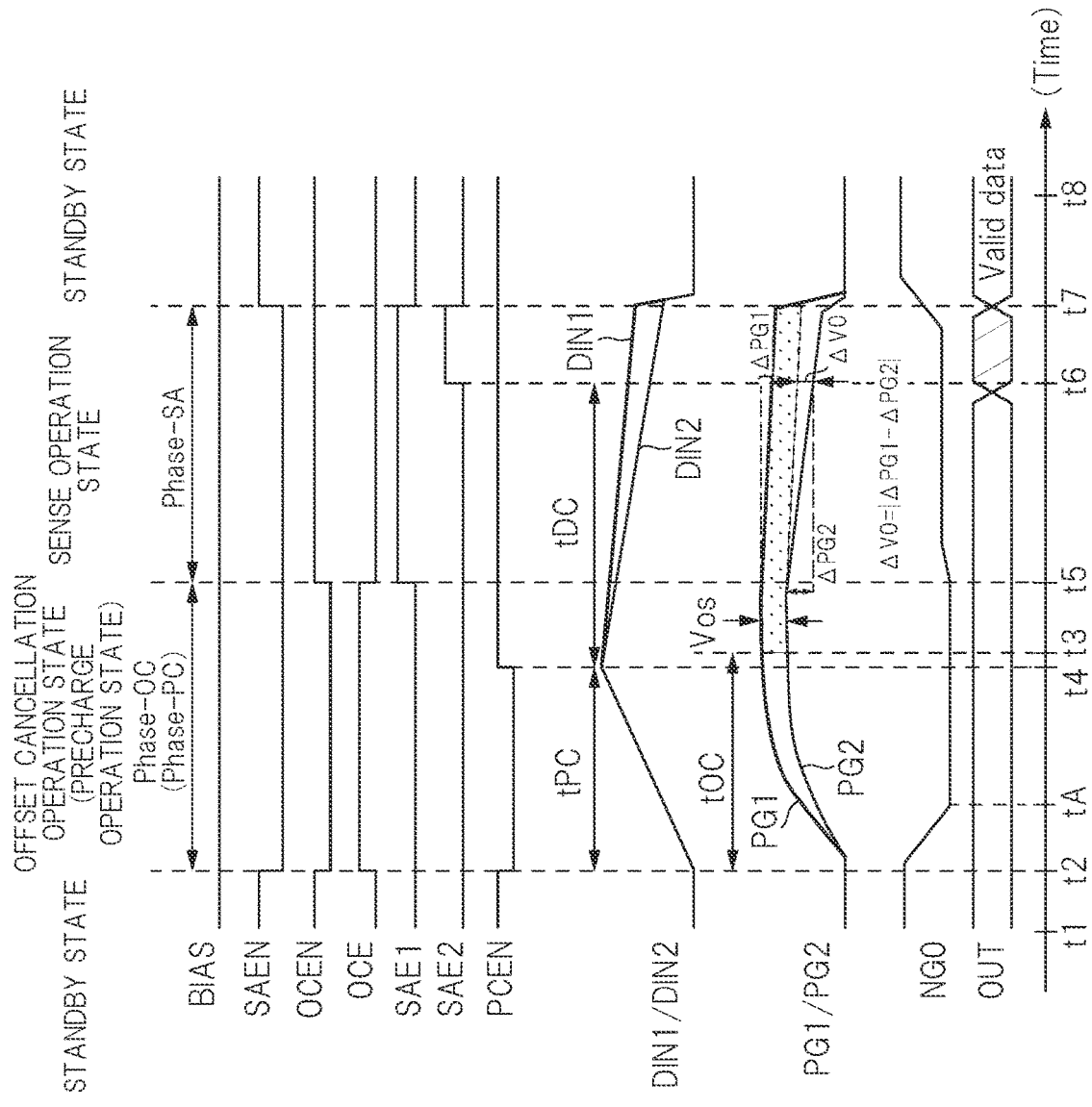
FIG. 10 is a timing chart in the sense amplifier according to the second embodiment.

FIG. 10 is a timing chart in the sense amplifier according to the second embodiment. The operation of the sense amplifier 8C according to the second embodiment can be divided into an offset cancellation operation, a precharge operation and a sense operation. A part or all of a discharge operation is included in the sense operation. An operation period of the sense amplifier 8C can be divided into an offset cancellation operation period Phase-OC, a precharge operation period Phase-PC, and a sense operation period Phase-SA. Note that a part or all of each of the offset cancellation operation and the precharge operation is performed concurrently with other. Therefore, a part or all of each of the offset cancellation operation period Phase-OC and the precharge operation period Phase-PC overlaps the other. Moreover, a state of the sense amplifier 8C can be divided into a standby state, an offset cancellation operation state, a precharge operation state and a sense operation state.

The offset cancellation operation is an operation to make an advance preparation so that an offset voltage of the sense amplifier 8C is cancelled at the time of the sense operation of the sense amplifier 8C. Specifically, the offset cancellation operation is an operation to charge the capacitors 19 and 20 so that a voltage obtained by converting the offset voltage of the sense amplifier 8C into an input voltage to the data input paths DIN1 and DIN2 is accumulated as a voltage difference in the capacitors 19 and 20. The precharge operation is a preparation operation before performing the sense operation, and is an operation to charge electric charges to these paths so that the data input paths DIN1 and DIN2 reach a predetermined voltage. Moreover, the sense operation is an operation to compare, with each other, weak signals input to the data input paths DIN1 and DIN2, to amplify a difference therebetween, and to output the amplified difference as a data value readable by an analog circuit.

First, the offset cancellation operation in the offset cancellation operation period Phase-OC is described.

As shown in FIG. 10, at the time t1, the signal SAEN, the signal OCEN and the signal PCEN are individually at the "H" level, and the signal SAE1 and the signal SAE2 are individually at the "L" level. Note that the signal BIAS remains at the level between "H" and "L" during a period of repeating the data reading.

At the time t1, since the signal SAEN is at the "H" level, potentials of gates of the PMOS transistors 13 and 14 are at the "H" level, and the PMOS transistors 13 and 14 are "off". Thus, the circuit below the PMOS transistors 13 and 14 is separated, and unnecessary current consumption can be reduced.

Moreover, since the signal SAEN is at the "H" level, potentials of gates of the NMOS transistors 31 and 32 are at the "H" level, and the NMOS transistors 31 and 32 are "on". Moreover, since the signal OCEN is at the "H" level, the switches 21 and 22 are "off". Hence, potentials of the nodes PG1 and PG2 are at a level of a potential of the power supply VSS, and are in an initialized state.

Moreover, since the signal OCEN and the signal PCEN are at the "H" level, the PMOS transistors 15, 16, 43 and 44 are "off", and the operation to precharge the data input paths DIN1 and DIN2 from the power supplies VDD2 and VDD4 is not performed.

At a time t2, the signal SAE1 and the signal SAE2 individually remain at the "L" level, but the signal SAEN, the signal OCEN and the signal PCEN individually switch from the "H" level to the "L" level. Thus, the sense amplifier 8C enters the offset cancellation operation and the precharge operation.

At the time t2, since the signal SAEN is at the "L" level, the potentials of the gates of the NMOS transistors 31 and 32 turn to the "L" level, and the NMOS transistors 31 and 32 turn "off". Potentials of the gates of the PMOS transistors 13 and 14 turn to the "L" level, and the PMOS transistors 13 and 14 turn "on". Since the signal SAE1 is at the "L" level, the potential of the gate of the NMOS transistor 35 is at the "L" level, and the NMOS transistor 35 turns "off". Meanwhile, the potential of the gate of the NMOS transistor 36 is at the "H" level, and the NMOS transistor 26 turns "on". That is, the node NGO is connected to the node AB1.

Moreover, since the signal BIAS is at the level between "H" and "L", the PMOS transistor 39 and the parallel circuit of the NMOS transistors 33 and 34 turn "on", a current starts to flow from the path of the power supply VDD1 and gradually increases, and finally, the saturated tail current Ibias flows. In addition, the node AB1, that is, the node NGO gradually decreases in potential from the potential of the power supply VDD1, reaches a certain fixed potential at the point of time of a time tA, and thereafter, remains at that potential.

Further, since the signal OCEN and the signal PCEN are individually at the "L" level, the switches 21 and 22 turn "on". That is, a current flows from the node COM, which is a source supply common to the PMOS transistors 11 and 12, via the PMOS transistor 11 and the switch 21 to the node PG1, and the capacitor 19 is charged. Moreover, a current flows from the node COM via the PMOS transistor 12 and the switch 22 to the node PG2, and the capacitor 20 is charged.

Thus, the capacitors 19 and 20 are charged so that a voltage Vos, which is a voltage obtained by converting the offset voltage of the sense amplifier 8C into the input voltage, appears as a differential voltage between an inter-terminal voltage of the capacitor 19 and an inter-terminal voltage of the capacitor 20. At this time, not only the path that passes from the power supply VDD1 through the PMOS transistor 37 but also the path that passes from the power supply VDD3 through the PMOS transistor 38 is added as the power supply path to the node COM that serves as the current source CS. Hence, charge currents to the capacitors 19 and 20 increase, and the capacitors 19 and 20 are charged at a higher speed, thus making it possible to shorten the offset cancellation time tOC required for the offset cancellation.

Moreover, the NMOS transistors 17 and 18 constitute a current mirror circuit together with the parallel circuit of the NMOS transistors 33 and 34. This has a function to match, with each other, operating points of the NMOS transistors 17 and 18 in the sense operation 25 period after the offset cancellation operation period.

Moreover, the sum of currents flowing through the NMOS transistors 17 and 18 is set to the same extent as that of the tail current Ibias by the tail current source TCS from the power supply VDD1, for example, so as to be 50% to 150% of Ibias. More suitably, the sum of currents flowing through the NMOS transistors 17 and 18 is set to the tail current Ibias×100%. Thus, the currents flowing through the PMOS transistors 11 and 12 can be controlled to the same extent between time of the offset cancellation operation state and the time of the sense operation state, thus making it possible to perform the offset cancellation with high accuracy.

Note that a mirror ratio of this current mirror is recommended to be set so that currents as 50% of the tail current Ibias flow through the NMOS transistors 17 and 18. In the present embodiment, for the NMOS transistors 17 and 18, a transistor size of these pair transistors is individually set so that the currents as 50% of the tail current Ibias flow therethrough.

Since the signal OCEN and the signal PCEN are at the "L" level, the PMOS transistors 15, 16, 43 and 44 turn "on", and the PMOS transistors 41 and 42 turn "off". Thus, the data input paths DIN1 and DIN2 are precharged from the power supplies VDD2 and VDD4, and the potentials of the data input paths DIN1 and DIN2 gradually rise from the time t2, and reach the power supply voltage VDD of the power supply VDD2 at the time t3 after the elapse of the precharge time tPC.

Moreover, in the offset cancellation operation period, not only the offset cancellation operation, but also concurrently performed are the precharge operation for the data input paths DIN1 and DIN2 and the operation of matching the operating points of the NMOS 15 transistors 17 and 18 with each other in the sense operation period.

Incidentally, in the present embodiment, a case is assumed where the currents suppliable from the power supplies VDD1 and VDD3 for use int he offset cancellation operation cannot be increased sufficiently. In this case, the shortening of the time required to complete the offset cancellation operation is limited. Therefore, as shown in FIG. 10, it 20 is assumed that the time t3 when the offset cancellation operation (charging the capacitors 19 and 20) is completed becomes later than the time t4 when the precharge operation is completed.

Accordingly, the signal PCEN is switched from "L" to the "H" level at the time t4 when the precharge operation is considered to be completed. When the signal PCEN turns to the "H" level, the PMOS transistors 43 and 44 turn "off". That is, the precharge operation to the input paths DIN1 and DIN2 stops in a state in which the paths from the capacitors 19 and 20 to the data input paths DIN1 and DIN2 are blocked.

However, since the signal OCEN remains at the "L" level, the potentials of the nodes N1 and N2 which are the input terminals of the capacitors 19 and 20 are caused to remain at the power supply voltage VDD of the power supply VDD2. Moreover, the PMOS transistor 38 is also "on". Thus, the charge currents flow from the power supplies VDD1 and VDD3 to the capacitors 19 and 20, and the offset cancellation operation is continued. Meanwhile, for the data input paths DIN1 and DIN2, the discharge operation is started after the precharge operation stops. That is, the period of the precharge operation is shortened, and in addition, the discharge operation is started before the offset cancellation operation is completed. That is, the discharge operation is performed concurrently with the offset cancellation operation without waiting for the completion of the offset cancellation operation.

By such an operation, it becomes possible to shorten the entire operation time of the sense amplifier 8C even if the current suppliable from the power supply VDD1 or the power supply VDD3 cannot be ensured sufficiently and it is difficult to sufficiently shorten the time required for the offset cancellation operation.

A time t5 is set as a time after a certain period of time elapses from the time t3. At the time t5, the signal OCEN turns to the "H" level, the PMOS transistors 15 and 16 turn "off", the PMOS transistors 41 and 42 turn "on", and the switches 21 and 22 turn "off". Moreover, at the time t5, the signal SAE switches from the "L" to the "H" level, the NMOS transistor 35 turns "on", and the NMOS transistor 36 turns "off". Thus, the NMOS transistors 17 and 18 which are a load element pair form a current mirror circuit in such a manner that gates thereof are connected to each other. Moreover, the gates of the NMOS transistors 17 and 18 are separated from the node AB1. When this connection state is formed, the operation state of the sense amplifier 8C turns to the sense operation state, and the sense operation is started.

Note that a sense operation in the sense operation period Phase-SA that follows is similar to that of the sense amplifier 8B, and accordingly, a description thereof is omitted.

According to such a sense amplifier 8C as described above, the capacitors 19 and 20 are charged with flows of currents from the node COM that is a current supply source so that there appears, as a differential voltage, the voltage Vos obtained by converting the offset voltage of the sense amplifier 8C into the input voltage. At this time, the node COM is supplied with currents not only from the path from the power supply VDD1 but also from the power supply VDD3. That is, the amount of currents suppliable from the node COM to the capacitors 19 and 20 can be increased to more than the current suppliable by the power supply VDD1.

Thus, the capacitors 19 and 20 can be charged at a higher speed, and it becomes possible to largely shorten the offset cancellation time tOC. Note that, preferably, the amount of current suppliable by the power supply VDD3 is larger than the current suppliable by the power supply VDD1.

Moreover, electric charges precharged to the data input paths DIN1 and DIN2 are gradually discharged according to readout data, and the potentials of the data input paths DIN1 and DIN2 gradually decrease concurrently therewith. Potentials of the nodes PG1 and PG2 also decrease due to an influence of coupling with the capacitors 19 and 20.

Moreover, the capacitors 19 and 20 in each of which a charging voltage is continuously variable are provided in order to compensate for the offset voltage of the sense amplifier, and accordingly, accuracy of the offset cancellation is high. Further, by the above-described sense operation, a differential amplification signal between the signal of the bit line BL and the signal of the reference signal line REF appears in the nodes OT1 and OT2, and the signals of the nodes OT1 and OT2 are further subjected to the differential amplification by the differential amplifier 23, and are output. Therefore, a comparative resolution between the signals input to the data input paths DIN1 and DIN2 is high.

Moreover, even if the offset cancellation time tOC becomes longer than the precharge time tPC, the discharge operation can be started without waiting for the offset cancellation operation, and the shortening of the entire operation time of the sense amplifier 8C can be achieved.

As described above, while suppressing the influence of the offset voltage of the sense amplifier by the offset cancellation mechanism, the sense amplifier 8C according to the second embodiment becomes able to shorten the offset cancellation time tOC, and further, to shorten the precharge time tPC, and can achieve the speed enhancement of the data reading.

Third Embodiment

A sense amplifier according to a third embodiment is described. The sense amplifier according to the third embodiment is an example of further improving the sense amplifiers of the above-described two embodiments.

Configuration and Operation of Sense Amplifier According to Third Embodiment

Figure 11:
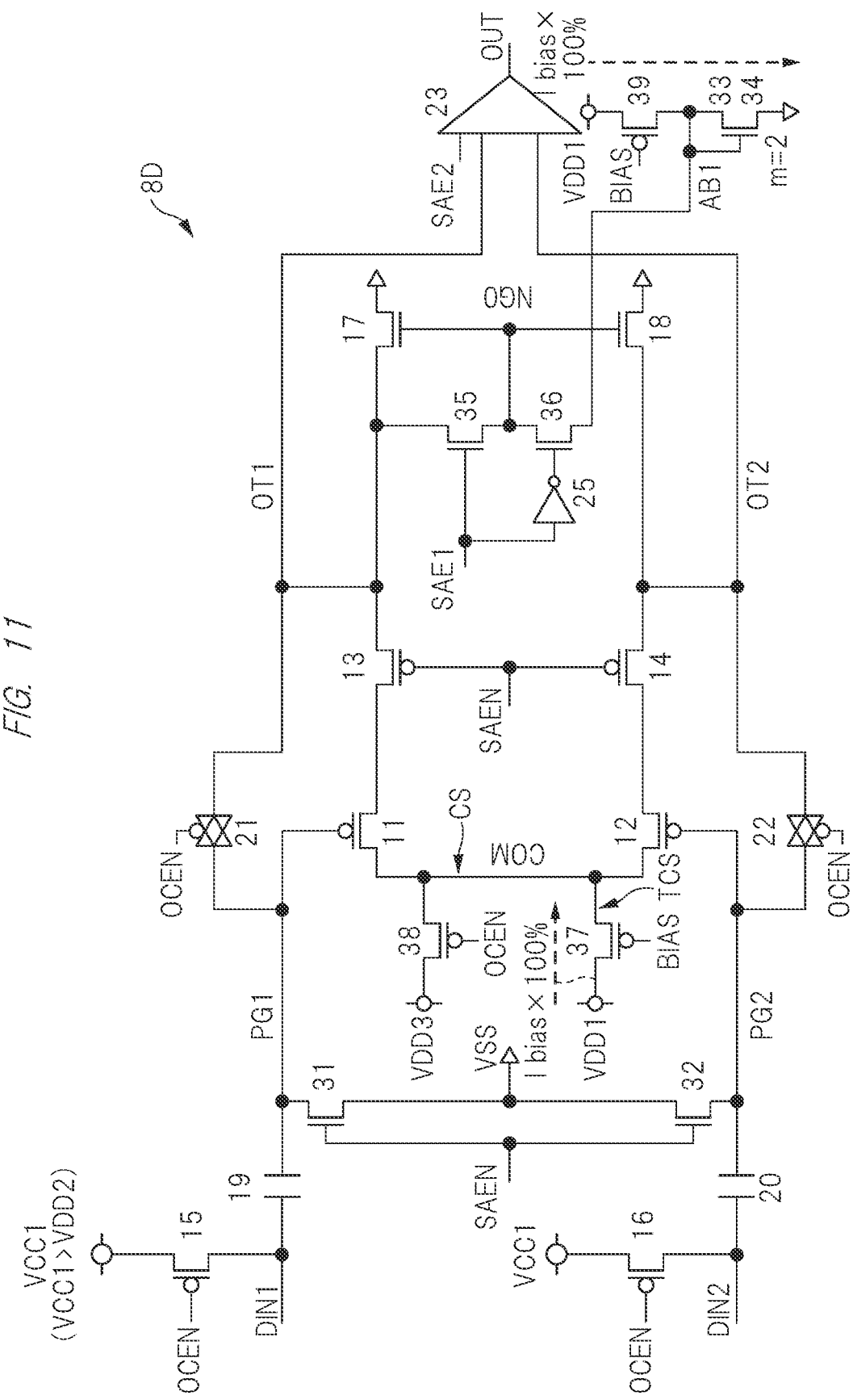
FIG. 11 is a diagram showing a configuration of a sense amplifier according to a third embodiment.

FIG. 11 is a diagram showing a configuration of the sense amplifier according to the third embodiment. Note that FIG. 11 is an example where, as an example, an improved technology of the third embodiment is applied to the first embodiment.

As shown in FIG. 11, the capacitors 19 and 20 also function as decouplings between the data input path DIN1 and the node PG1 and between the data input path DIN2 and the node PG2. Therefore, it becomes possible to use different voltages between the power supply for use in the precharge of the data input paths DIN1 and DIN2 and the power supply of the circuit that performs the sense operation.

Accordingly, as shown in FIG. 11, in comparison with the sense amplifiers 8A to 8C according to the standard technology, the first embodiment and the second embodiment, which are described above, a sense amplifier 8D according to the third embodiment has a configuration in which the power supply for use in the precharge to the data input paths DIN1 and DIN2 is changed to a power supply VCC1 (an example of a "fourth power supply" in the present application) with a power supply voltage higher than that of the VDD2. For example, the power supply voltage of the power supply VDD2 is 1 [V], and the power supply voltage of the power supply VCC1 is 1.5 [V].

According to the sense amplifier 8D with the above-described configuration, a power supply with a higher voltage is used as the power supply for use in the precharge, whereby the currents at the time of precharging the data input paths DIN1 and DIN2 can be increased, and the precharge time tPC can be further shortened.

Figure 12:
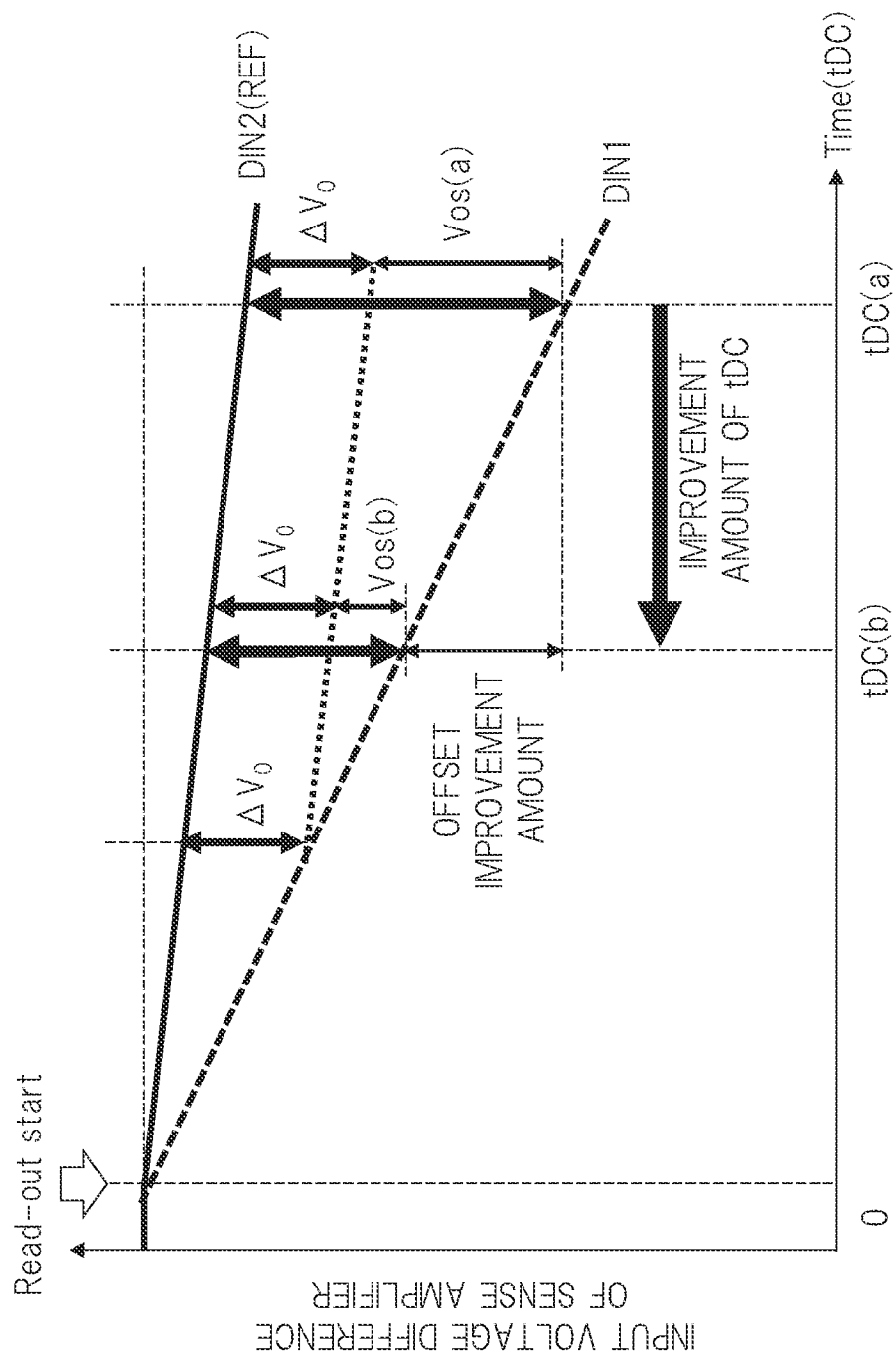
FIG. 12 is a diagram showing a relationship between a discharge time and a sense amplifier input voltage difference.

Relationship Between Discharge Time and Input Voltage Difference of Sense Amplifier FIG. 12 is a diagram showing a relationship between a discharge time and a sense amplifier input voltage difference. In FIG. 12, a horizontal axis indicates the discharge time tDC of the data input paths DIN1 and DIN2, and a vertical axis indicates the input voltage difference of the sense amplifier.

Moreover, the following Equation (1) is a calculation formula for calculating the discharge time tDC of the data input paths DIN1 and DIN2.

$$tDC=(C/\Delta I0)\times(\Delta V0+Vos) \quad (1)$$

$\Delta V0$: minimum input differential voltage (in case of Vos=0V) required for sense operation Vos: offset voltage (voltage converted into input voltage) intrinsic to sense amplifier C: parasitic capacitance at time of discharging bit line and the like $\Delta I0$: difference current between memory cell current Icell and reference current Iref As seen from FIG. 12 and the above-described equation, when the voltage Vos is a voltage Vos(a), the input voltage difference (voltage difference between the data input paths DIN1 and DIN2) of the sense amplifier, which is required for the sense operation, becomes $\Delta V0+\Delta Vos(a)$. Then, a discharge time tDC (a) required in order that the input voltage difference of the sense amplifier becomes $\Delta V0+\Delta Vos(a)$ becomes $(C/\Delta I0)\times(\Delta V0+Vos)a))$. Meanwhile, when the voltage Vos is a voltage Vos(b) smaller than the voltage Vos(a), the input voltage difference (voltage difference between the data input paths DIN1 and DIN2) of the sense amplifier, which is required for the sense operation, becomes $\Delta V0+\Delta Vos(b)$. Then, a discharge time tDC(b) required in order that the input voltage difference of the sense amplifier becomes $\Delta V0+\Delta Vos(b)$ becomes $(C/\Delta I0)\times(\Delta V0+Vos)b))$.

From the above, as the voltage Vos is smaller, the discharge time tDC required for the sense operation can be shortened. That is, it is seen that, when the accuracy of the offset cancellation is improved, and an improvement amount of the offset increases, then the discharge time tDC by the memory cell current Icell is shortened, and an improvement amount of the discharge time tDC increases.

Effect of Shortening Operation Time of Sense Amplifier According to Respective Embodiments Each of the sense amplifiers 8B and 8C of the first and second embodiments not only has the offset cancellation mechanism, but also has the mechanism to increase the amount of currents suppliable to the capacitors 19 and 20 for the offset cancellation. Therefore, each of the sense amplifiers 8B and 8C becomes able to shorten the discharge time tDC, and in addition, becomes able to shorten the offset cancellation time tOC in comparison with the sense amplifier 8A.

Moreover, in each of the sense amplifiers 8B and 8C of the first and second embodiments, the precharge operation and the offset cancellation operation are performed concurrently with each other, and larger currents are supplied to charge the capacitors in the offset cancellation operation. Therefore, in each of the sense amplifiers 8B and 8C, as the paths of the currents supplied in order to precharge the data input paths DIN1 and DIN2, not only the paths which pass through the PMOS transistors 15 and 16 but also the paths which pass via the capacitors 19 and 20 are added, and it becomes possible to further shorten the precharge time tPC.

Moreover, the sense amplifier 8D of the third embodiment has such a configuration in which the power supply VCC1 in which the power supply voltage is the voltage VCC larger than the voltage VDD is used as the power supply for use in the precharge to the data input paths DIN1 and DIN2. Therefore, the sense amplifier 8D can further increase the amount of current flowing in the precharge operation, and becomes able to further shorten the precharge time tPC.

Figure 13:
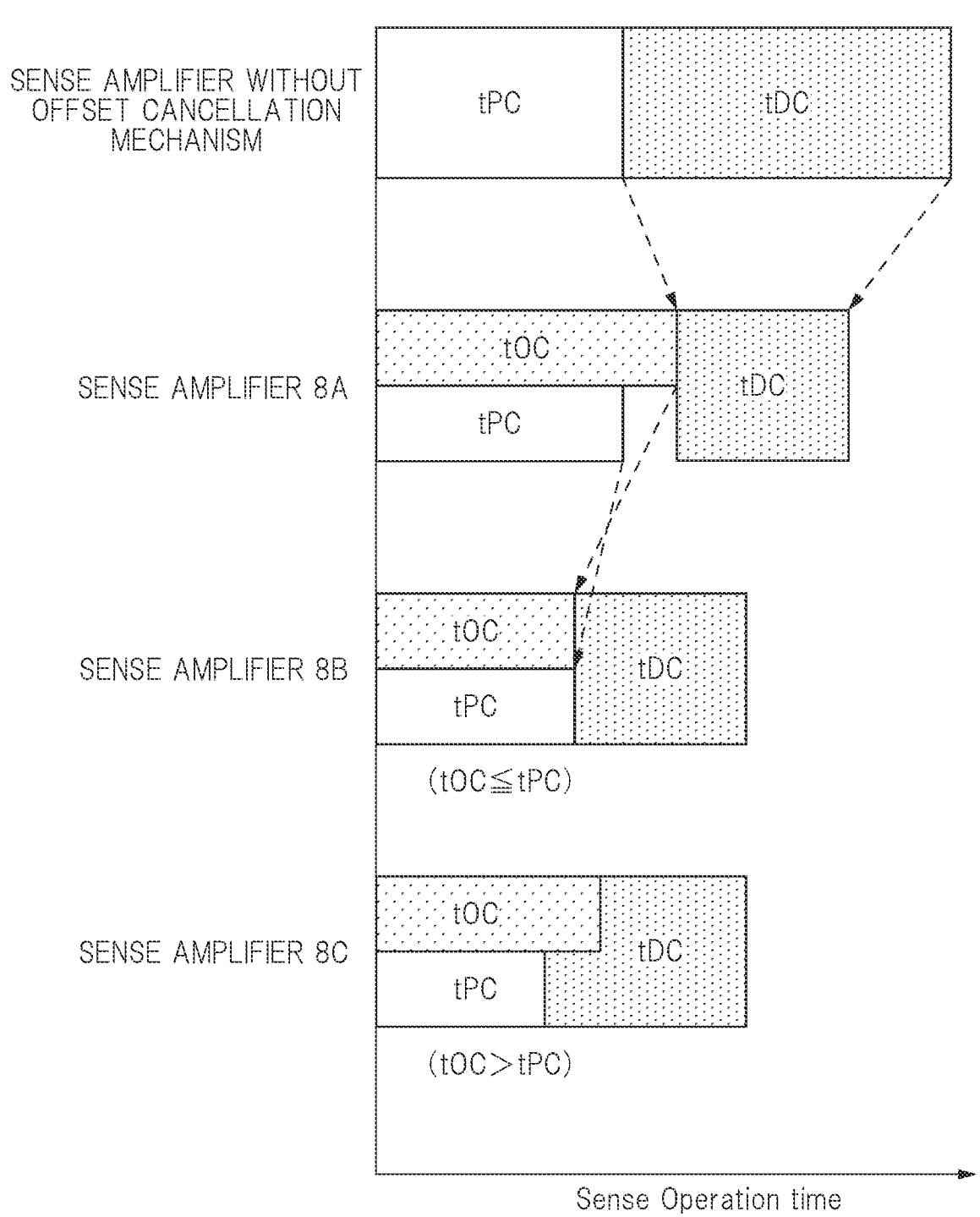
FIG. 13 is a diagram showing an operation time of each of the sense amplifiers.

Entire Operation Time of Sense Amplifier According to Each of Standard Technology and Embodiments FIG. 13 is a diagram showing an operation time of each of the sense amplifiers. In each of bar graphs shown in FIG. 13, the operation time taken to operate each of the sense amplifiers is indicated on a horizontal axis, and a type of the sense amplifier is shown on a vertical axis. The operation time of the sense amplifier includes the precharge time tPC, the offset cancellation time tOC, and the discharge time tDC, and blocks (frames) which indicate a time corresponding to such operations which can be performed concurrently with each other are illustrated in vertically parallel to each other.

In FIG. 13, a first graph from the top corresponds to a case of a sense amplifier without an offset cancellation function equipped. A second graph from the top corresponds to a case of the sense amplifier 8A equipped with the offset cancellation mechanism according to the standard technology. A third graph from the top corresponds to a case of the sense amplifier according to the first embodiment. A fourth graph from the top corresponds to a case of the sense amplifier according to the second embodiment.

In the case of the sense amplifier without the offset cancellation mechanism, the influence of the offset voltage cannot be suppressed, and as mentioned above, the discharge time tDC becomes relatively long.

Next, in the case of the sense amplifier 8A according to the standard technology, since the offset cancellation mechanism is provided, the influence of the offset voltage can be suppressed, and the discharge time tDC is shortened. Meanwhile, since the currents charged to the capacitors 19 and 20 are limited to the tail current Ibias from the power supply VDD1, the offset cancellation time tOC becomes relatively longer than the precharge time tPC. Therefore, there is room for further shortening the entire operation time of the sense amplifier.

Subsequently, in the case of the sense amplifier 8B according to the first embodiment, since the offset cancellation mechanism is provided, the discharge time tDC is shortened as in the sense amplifier 8A. Moreover, as the currents charged to the capacitors 19 and 20, not only the tail current Ibias from the power supply VDD1 but also the current from the power supply VDD3 is charged. Accordingly, the offset cancellation time tOC is shortened to be equal to or shorter than the precharge time tPC. Therefore, the entire operation time of the sense amplifier is shortened to a large extent.

Subsequently, in the case of the sense amplifier 8C according to the second embodiment, since the offset cancellation mechanism is provided, the discharge time tDC is shortened as in the sense amplifier 8A. Meanwhile, when the currents charged to the capacitors 19 and 20 cannot be ensured sufficiently, the currents for the precharge are increased more, and the precharge time tPC is shortened. In addition, the discharge operation is started before the completion of the offset operation, and is partially executed concurrently therewith, whereby the offset cancellation time tOC is prevented from being lengthened. Thus, it becomes possible to equalize the entire operation time of the sense amplifier substantially to that in the case of the sense amplifier 8B.

Fourth Embodiment

A semiconductor device including each of the above-described sense amplifiers is also an embodiment of the present application. Specifically, for example, the semiconductor device is a semiconductor device including: a plurality of memory cells (memory cells MCnm in memory array 2); a selection circuit (address decoder 4) that selects one from among the above-described plurality of memory cells; a reference signal generator 9 that generates a reference signal and outputs the reference signal to a reference signal line (REF); and any one of the differential amplifiers (sense amplifiers 8A to 8D), wherein a bit line (BL) of the memory cell selected by the selection circuit is connected to one terminal of the external input terminal pair (DIN1, DIN2) of the differential amplifier and the reference signal line (REF) is connected to other terminal of the external input terminal pair.

Fifth Embodiment

An offset cancellation method of the sense amplifier is also an embodiment of the present application. Specifically, for example, the offset cancellation method is an offset cancellation method for cancelling an offset voltage of an input terminal pair of a sense amplifier (differential amplifier), wherein the above-described sense amplifier (differential amplifier) includes: a current source that is connected to a first power supply in which a suppliable current is a first current; an active element pair that is connected to the current source, and amplifies a signal input to an input terminal pair to output an output signal pair; a load element pair that is connected to a second power supply different in power supply voltage from the first power supply, the load element pair serving for outputting the output signal pair to an output terminal pair; a capacitance element pair that is inserted between an external input terminal pair and the input terminal pair, the offset cancellation method including: performing an offset cancellation operation to charge the capacitance element pair such as to cause the capacitance element pair to generate a voltage by short-circuiting corresponding terminals between the output terminal pair and the input terminal pair, the voltage being obtained by converting an offset voltage of the input terminal pair into an input voltage; and controlling a current suppliable by the current source to be a second current larger than a first current at a time of performing the offset cancellation operation.

The variety of embodiments of the present invention have been described above; however, the present invention is not limited to the above-described embodiments, and incorporates a variety of modified examples. Moreover, the above-described embodiments are those described in detail in order to clearly explain the present invention, and are not necessarily limited to those including all the described components. Further, it is possible to replace a part of components of a certain embodiment by components of the other embodiments, and it is also possible to add the components of the other embodiments to the components of a certain embodiment. All of these are incorporated in the scope of the present invention. Further, numeric values and the like, which are included in the text and the drawings, are merely examples, and do not damage the effects of the present invention even if those different from the above are used.

What is claimed is:

1. A differential amplifier comprising:
a current source that is connected to a first power supply in which a suppliable current is a first current;
an active element pair that is connected to the current source, and amplifies a signal input to an input terminal pair to output an output signal pair;
a load element pair that is connected to a second power supply different in power supply voltage from the first power supply, the load element pair serving for outputting the output signal pair to an output terminal pair;
a capacitance element pair that is inserted between an external input terminal pair and the input terminal pair;
a switching element pair that performs an offset cancellation operation to charge the capacitance element pair such as to cause the capacitance element pair to generate a voltage by short-circuiting corresponding terminals between the output terminal pair and the input terminal pair, the voltage being obtained by converting an offset voltage of the input terminal pair into an input voltage; and
a current control circuit that controls a current suppliable by the current source to be a second current larger than the first current at a time of performing the offset cancellation operation.

2. The differential amplifier according to claim 1, wherein the current control circuit connects, to the current source, a third power supply different in current supply path from the first power supply at the time of performing the offset cancellation operation.

3. The differential amplifier according to claim 1, further comprising an initialization circuit that is connected to the second power supply, and initializes the input terminal pair to a potential of the second power supply before starting the offset cancellation operation.

4. The differential amplifier according to claim 3, further comprising a state control circuit that controls a circuit or an element that constitutes the differential amplifier such that a state of the differential amplifier switches in order of a standby state, an offset cancellation operation state, a sense operation state, and the standby state,
wherein the initialization circuit initializes the input terminal pair to the potential of the second power supply in a period of the standby state, and is separated from the input terminal pair in a period different from the period of the standby state, and
wherein the current control circuit controls the current suppliable by the current source to be the second current in a period of the offset cancellation operation state, and controls the current suppliable by the current source to be the first current in a period of the sense operation state.

5. The differential amplifier according to claim 3, further comprising:
a state control circuit that controls a circuit or an element that constitutes the differential amplifier such that a state of the differential amplifier switches in order of a standby state, an offset cancellation operation state, a sense operation state, and the standby state; and
a load control circuit that controls a sum of currents flowing through the load element pair to be a current equal to 50% to 150% of the first current in a period of the offset cancellation operation state.

6. The differential amplifier according to claim 1, further comprising: an element pair through which a current flows; and
a load control circuit that switches a connection destination of the load element pair such that the load element pair constitutes a current mirror circuit together with the element pair at the time of performing the offset cancellation operation.

7. The differential amplifier according to claim 1, further comprising a precharge circuit that connects, to the external input terminal pair, a fourth power supply higher in power supply voltage than the first power supply, and precharges the external input terminal pair with a potential of the fourth power supply.

8. The differential amplifier according to claim 1, further comprising a precharge circuit that connects a fifth power supply to the external input terminal pair, and precharges the external input terminal pair with a potential of the fifth power supply,
wherein the offset cancellation operation is performed in a period while a precharge operation is performed by the precharge circuit,
wherein the offset cancellation operation is then stopped,
wherein, after the offset cancellation operation is stopped, the precharge operation is stopped, and a discharge operation of the external input terminal pair is started, and
wherein a reading operation of an output based on the output signal pair is enabled to be started.

9. The differential amplifier according to claim 1, further comprising a precharge circuit that connects a fifth power supply to the external input terminal pair, and precharges the external input terminal pair with a potential of the fifth power supply,
wherein the offset cancellation operation is performed in a period while a precharge operation is performed by the precharge circuit,
wherein, in a period of the offset cancellation operation, the precharge operation is stopped, and a discharge operation of the external input terminal pair is started,
wherein the offset cancellation operation is stopped after the discharge operation is started, and
wherein a reading operation of an output based on the output signal pair is enabled to be started.

10. The differential amplifier according to claim 9,
wherein the precharge circuit includes:

a second switching element pair connected between the capacitance element pair and the external input terminal pair;
a third switching element pair connected between the fifth power supply and a node pair between the capacitance element pair and the second switching element pair; and
a fourth switching element pair connected between a sixth power supply and a node pair between the second switching element pair and the external input terminal pair,
wherein the precharge operation is stopped and the discharge operation is started by shifting a state from a state in which the second switching element pair is deactivated and the third and fourth switching element pairs are activated to a state in which the fourth switching element pair is deactivated.

11. The differential amplifier according to claim 1,
wherein a power supply voltage of the second power supply is a ground voltage of the differential amplifier.

12. A semiconductor device comprising:
a plurality of memory cells;
a selection circuit that selects one from among the plurality of memory cells;
a reference signal generator that generates a reference signal and outputs the reference signal to a reference signal line; and
the differential amplifier according to claim 1,
wherein a bit line of the memory cell selected by the selection circuit is connected to one terminal of the external input terminal pair of the differential amplifier and the reference signal line is connected to other terminal of the external input terminal pair.

13. An offset cancellation method for cancelling an offset voltage of an input terminal pair of a differential amplifier,
wherein the differential amplifier includes:
a current source that is connected to a first power supply in which a suppliable current is a first current;
an active element pair that is connected to the current source, and amplifies a signal input to an input terminal pair to output an output signal pair;
a load element pair that is connected to a second power supply different in power supply voltage from the first power supply, the load element pair serving for outputting the output signal pair to an output terminal pair; and
a capacitance element pair that is inserted between an external input terminal pair and the input terminal pair,
the offset cancellation method comprising:
performing an offset cancellation operation to charge the capacitance element pair such as to cause the capacitance element pair to generate a voltage by short-circuiting corresponding terminals between the output terminal pair and the input terminal pair, the voltage being obtained by converting an offset voltage of the input terminal pair into an input voltage; and
controlling a current suppliable by the current source to be a second current larger than a first current at a time of performing the offset cancellation operation.

* * * * *